United States Patent [19]
Yamazaki et al.

[11] Patent Number: 5,716,871
[45] Date of Patent: Feb. 10, 1998

[54] SEMICONDUCTOR DEVICE AND METHOD OF FORMING THE SAME

[75] Inventors: Shunpei Yamazaki, Tokyo; Akira Mase, Aichi; Hideki Uochi, Kanagawa; Yasuhiko Takemura, Kanagwa, all of Japan

[73] Assignee: Semiconductor Energy Laboratory Co., Ltd., Kanagawa, Japan

[21] Appl. No.: 117,709

[22] Filed: Sep. 8, 1993

Related U.S. Application Data

[60] Division of Ser. No. 953,943, Sep. 30, 1992, Pat. No. 5,495,121, which is a continuation-in-part of Ser. No. 846,164, Mar. 5, 1992, Pat. No. 5,289,030.

[30] Foreign Application Priority Data

| Sep. 30, 1991 | [JP] | Japan | 3-278704 |
| Sep. 30, 1991 | [JP] | Japan | 3-278706 |
| Jun. 9, 1992 | [JP] | Japan | 4-174882 |
| Aug. 12, 1992 | [JP] | Japan | 4-237764 |

[51] Int. Cl.⁶ ............................................. H01L 21/44
[52] U.S. Cl. .................. 437/195; 437/983; 437/985; 148/116; 148/117
[58] Field of Search .................. 437/195, 983, 437/985; 148/DIG. 116, DIG. 117

[56] References Cited

U.S. PATENT DOCUMENTS

| 4,021,789 | 5/1977 | Furman et al. | |
| 4,149,307 | 4/1979 | Henderson . | |
| 4,221,045 | 9/1980 | Godejahn, Jr. . | |
| 4,338,139 | 7/1982 | Shinada . | |
| 4,433,004 | 2/1984 | Yonezawa et al. | 427/38 |
| 4,474,829 | 10/1984 | Peters . | |
| 4,502,204 | 3/1985 | Togashi et al. | 437/244 |
| 4,593,454 | 6/1986 | Baudrant et al. . | |
| 4,613,956 | 9/1986 | Paterson et al. | 356/185 |
| 4,943,836 | 7/1990 | Mori | 357/23.5 |
| 5,101,249 | 3/1992 | Hijuya et al. | 357/23.5 |
| 5,108,940 | 4/1992 | Williams | 437/44 |
| 5,172,200 | 12/1992 | Muragishi et al. | 257/315 |
| 5,409,851 | 4/1995 | Oh | 437/41 |
| 5,474,945 | 12/1995 | Yamazaki et al. | 437/141 |

FOREIGN PATENT DOCUMENTS 56-90527  12/1979  Japan .

*Primary Examiner*—John Niebling
*Assistant Examiner*—C. Everhart
*Attorney, Agent, or Firm*—Sixbey, Friedman, Leedom & Ferguson, P.C.; Gerald J. Ferguson, Jr.

[57] ABSTRACT

A semiconductor device or a semiconductor integrated circuit includes a field effect transistor having a source region, a drain region and a channel regions formed within a semiconductor substrate. A lower wiring is formed on the semiconductor substrate to form a gate electrode and its extension and oxidized to form an oxide film covering the lower wiring. An upper wiring is formed over the lower wiring on the semiconductor substrate to make contact with the drain or source region. The lower wiring is electrically insulated from the upper wiring by the oxide film.

26 Claims, 12 Drawing Sheets

SEMICONDUCTOR DEVICE AND METHOD OF FORMING THE SAME

This is a divisional application of Ser. No. 07/953,943 filed Sep. 30, 1992, now U.S. Pat. No. 5,495,121, which, in turn, is a continuation-in-part of Ser. No. 07/846,164 filed Mar. 5, 1992 (now U.S. Pat. No. 5,289,030).

BACKGROUND OF THE INVENTION

1. Field of the Invention

The present invention relates in general to a semiconductor device or a semiconductor integrated circuit and a method of forming the same.

2. Description of the Prior Art

A variety of approaches have been carried out in order to miniaturize integrated circuits and achieve a higher packing density in a chip. Particularly, remarkable advances have been reported in the development of the technology to miniaturize insulated gate field effect semiconductor devices, denoted as MOSFET for short. MOS is the acronym of Metal Oxide Semiconductor. The metal used in MOSFETs generally includes, in addition to genuine metals, conductive materials such as semiconductors having a sufficient conductivity, alloys composed of semiconductor(s) and/or metal(s). The oxide generally includes, in addition to genuine oxides, insulating materials having a sufficient resistivity such as nitrides. Although these materials do exactly not correspond to the acronym MOS, the term MOSFET is used in the broad sense in this description.

The miniaturizing of MOSFETs is realized by decreasing the width of the gate electrode. The decrease of the width of the gate electrode leads to the decrease of the channel length underlying the gate electrode. This also results in a high operational speed because the short channel length decreases the time required for carriers to pass across the channel.

The miniaturizing, on the other hand, gives rise to other problems, i.e. short channel effects. One of the most serious problems thereof is hot electron effects. In the structure comprising highly doped source and drain regions with an inversely doped intervening channel region therebetween, the strength of the electric field at the boundary between the channel region and the highly doped region increases as the channel length decreases. As a result, the characteristics of the device are unstable.

Referring to FIGS. 1(A) to 1(C), a prior art method of forming silicon gate MOSFETs is described. In the upper surface of a single crystalline semiconductor substrate such as a single crystalline silicon substrate 501, field insulating films are selectively formed by a suitable technique, e.g. LOCOS. The entire upper surface of the substrate is then oxidized by, e.g. dry thermal oxidation to form a gate insulating film 503. A gate electrode 505 of polysilicon is deposited on the gate insulating film 503. Impurity ions are introduced into the substrate by ion implantation with the gate electrode 505 as a mask in order to define source and drain regions as illustrated in FIG. 1(A).

Next, an interlayer insulating film 506 is formed from pure silicon oxide or phosphorus doped or boron doped silicon oxide as illustrated in FIG. 1(B), followed by opening contact holes 507 and 508 through the interlayer insulating film 506 and the silicon oxide film 503. Source and drain electrodes 509 and 510 are formed to make contact with the source region and the drain regions 504 as illustrated in FIG. (C).

As a result of the above process, there arise several problems. One problem is the disconnection of the source and drain electrodes or extensions thereof at the periphery of the contact holes 507 and 508 forming high and sharp steps. The height of the steps is determined substantially by the thickness of the interlayer insulating film 506 since the thickness of the gate insulating film 503 is very small as compared with that of the interlayer insulating film 506. The height is usually 200 to 500 nm and sometimes larger. This poses no problem when the diameter of the contact holes is relatively large. However, as the packing density integrated semiconductor devices in a chip increases, the diameter is required to be no larger than one micrometer while in the past contact holes of about 10 micrometers diameter were formed. On the other hand, the thickness of the interlayer insulating film is determined by tolerable capacitances among wirings and the dielectric characteristics of thereof so that it is impossible to furthermore decrease the thickness from the current level. As a result, the thickness of the interlayer insulating film can not be neglected as compared with the dimension of the contact holes and therefore it is often the case that necessary electrodes have not been formed completely inside the contact holes or have been disconnected because of poor step coverage and poor mechanical contact between the electrodes and the underlying surfaces.

Furthermore, as seen from FIGS. 1(A) and 1(C), impurity atoms necessarily go around under the gate electrode so that there is formed overlap therebetween resulting in an undesirable parasitic capacitance. Because of such overlap, a very strong electric field is applied to the gate insulating film, which is extremely thin, so that hot carriers tend to enter and be trapped in the gate insulating film.

The LDD (lightly-doped-drain) structure has been proposed to solve the above problem. This structure is schematically illustrated in FIG. 2(D). In the figure, reference numeral 604' designates a lightly doped region formed inside of a heavily doped region 605. The region 604' is called a LDD region. By provision of such a LDD region, the strength of the electric field in the vicinity of the boundary between the channel region and the drain region is decreased so that the operation of the device becomes more stable.

FIGS. 2(A) to 2(D) are cross sectional views showing a method of making a conventional MOSFET having a LDD structure. Although an n-channel transistor is explained here, a p-channel transistor is formed in the same manner simply by inverting the conductivity type. Namely, field insulating films 602 are first formed on a p-type silicon semiconductor substrate 601 as device separating regions in order to insulate each from other active regions (only one being shown in the figure) in which devices are fabricated. A gate insulating oxide film 603 and a conductive film are deposited on the semiconductor substrate and patterned by etching in order to form a gate electrode 605 insulated by the gate insulating film 603. With the gate electrode 605 and the field insulating films 602 as a mask, lightly doped regions 604 of an n− conductivity type are formed by ion implantation in a self-aligning fashion.

Next, the structure is coated with an insulating film 606 such as a PSG film. The insulating film 606 is removed by an anisotropic etching (directional etching) such as bias plasma etching, leaving spacers 607 flanking the side walls of the gate electrode 605. With the spacers 607 as a mask, heavily doped regions 605 of an n+ conductivity type are formed by ion implantation to provide source and drain regions, leaving LDD regions 604'. By employing this LDD design, the channel length can be decreased to as short as 0.1 micrometer while the channel length in usual designs can not be decreased to 0.5 micrometer or shorter.

The problems associated with such short channel designs, however, are not completely solved even by this technique. Another problem is the resistance of the gate electrode which has become narrow as a result from the decrease in channel length. Even if the switching speed of the device is increased by the short channel, the speed-up effects may possibly come to naught due to propagation delay along the high resistant gate electrode. The resistance of the gate electrode can be decreased to some extent by employing a metal silicide having a low resistivity in place of polysilicon to form the gate electrode or by providing a low resistant line such as an aluminum line extending along the gate electrode. These techniques, however, can not deal with the high resistance problem when the width of the gate electrode is no larger than 0.3 micrometer.

Another approach to solve the problem is to increase the aspect ratio of the gate electrode, i.e. the ratio of the height to the width of the gate electrode. The resistance of the gate electrode decreases in proportion to the cross sectional area which increases as the aspect ratio increases. From the view point of manufacture restraints, the aspect ratio can not be increased so much. This is mainly because the width of the spacers depends on the height of the gate electrode. The spacer is necessarily formed with its width of 20% or wider of the height of the gate electrode. Accordingly if 0.1 micrometer width L of the LDD region 604' (FIG. 2(D)) is desired, the height of the gate electrode can not exceed 0.5 micrometer. If the gate electrode has a height exceeding 0.5 micrometer, the width L exceeds 0.1 micrometer resulting in a higher resistance between the source and drain regions.

In the case of 0.5 micrometer height (H), 1.0 micrometer width (W) and 0.1 micrometer width (L) in FIG. 2(D), if the width (W) of the gate electrode is desired to be increased to 0.5 micrometer for further miniaturizing, the height of the electrode must be increased to 1.0 micrometer in order to avoid increase of the gate resistance. The width (L) of the spacers, however, becomes 0.2 micrometer so that the resistance between the source and drain regions with the FET being turned on is doubled. The halved channel length is expected to improve double the operational speed. The increase of double the source and drain resistance, however, cancels the improvement. Accordingly, the operational speed remains same as achieved before the shrinkage in size. On the other hand, if the width L is maintained at the conventional level, the height H must be 0.5 micrometer which makes double the resistance of the gate electrode, resulting in no improvement on the operational speed.

Usually, the width of the spacer becomes as wide as 50% to 100% of the height of the gate electrode, which width provides a further severe condition. The aspect ratios of the gate electrodes, therefore, have been no higher than 1, or in many cases no higher than 0.2 in accordance with the conventional LDD technique. In addition to this, the width of the spacer has been substantially dispersed, due to expected variations of production, which results in dispersed characteristics of the products. The conventional LDD technique has brought high integrations and high speeds and, on the contrary, impeded further improvement.

Of course, the problem of disconnection of wirings at step-wise boundaries of contact holes can not be solved since, also in the LDD technique, an interlayer insulating film is coated and contact holes are opened therethrough, followed by coating electrodes and wirings thereover in order to make electric contact with the underlying regions.

BRIEF SUMMARY OF THE INVENTION

It is an object of the present invention to obtain a high packing density of devices in a semiconductor integrated circuit design.

It is another object of the present invention to provide a method of forming a semiconductor integrated circuit with a high packing density.

It is a further object of the present invention to provide a method of forming variety types of insulated gate field effect semiconductor devices within semiconductor substrates having a new structure by virtue of which the yield is significantly improved.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a semiconductor integrated circuit is manufactured by the steps of forming a field insulating film in order to define an active region on a semiconductor substrate, forming necessary impurity regions within the semiconductor substrate, forming a lower wiring on the semiconductor substrate, anodic oxidizing the lower wiring, and forming an upper wiring on the semiconductor substrate over the lower wiring. The upper wiring may be connected with at least one of the impurity regions (source and drain regions).

A typical method of manufacturing an n-channel field effect transistor within a p-type silicon semiconductor substrate in accordance with the present invention will schematically be described in FIGS. 3(A) to 3(C). Field insulating films 102 are formed on a p-type single crystal silicon semiconductor 101 in order to define an active region therebetween by the so-called LOCOS technique. The active region between the field insulating films 102 is coated with a gate insulating film 103 of a thickness of 10 to 100 nm by thermal oxidation in the same manner as broadly employed in the art.

A conducting material is deposited and patterned by etching in order to provide a gate electrode 104, a gate wiring extending from the gate electrode and other necessary wirings on the field insulating film 102 as designated by 105. The material to be the gate electrode is made mainly of a semiconductor substance such as silicon or germanium or an alloy consisting of silicon and another suitable metal such as tungsten, molybdenum. In this condition, the gate insulating film 103 remains on the active region. However, the gate insulating film may be removed at the same time as the patterning of the gate electrode. The gate electrode may comprise a single layer comprising a material selected from the group consisting of silicon, $WSi_2$ and $MoSi_2$. The gate electrode may comprise a multi-layer of a phosphorus doped silicon film and a silicide film selected from the group consisting of a $WSi_2$ film and a $MoSi_2$ film. Impurity is introduced to the semiconductor substrate by ion implantation or plasma doping with the gate electrode as a mask in order to form $n^+$ type impurity regions 106 as source and drain regions in a self-alignment fashion. The impurity regions are formed to overlap the opposed edges of the gate electrode since the impurity goes round to the bottom side of the gate electrode as illustrated in FIG. 1(A). In the case of ion implantation, however, the width of overlapping which is caused by secondary ion scattering can be calculated from the energy of ions given during the implantation.

Next, as illustrated in FIG. 1(B), the external surfaces of the gate electrode 104 and the wiring 105 are anodic oxidized in order to form silicon oxide films 107 and 108. The anodic oxidation may be carried out by either wet process or dry process. The wet process goes on with oxidation in a solution. The dry process goes on with oxidation in a plasma.

In the case of the wet anoding, the semiconductor wafer formed with the gate electrode and the wirings is dipped in an electrolyte followed by passing an electric current therethrough with the gate electrode and the wirings functioning as an anode. The electric current may be a DC current or an AC current. In the case that the gate electrode and the wirings are made of silicon, silicon oxide is formed covering the gate electrode and the wirings. The silicon oxide film may, however, include some constituent elements of the electrolyte or partially form its hydrate, and therefore the electric characteristics are varied depending upon the actual type of the electrolyte employed. For example, carbon is included in the silicon oxide film when an organic acid is used as the electrolyte whereas sulfur is included in the silicon oxide film when sulfuric acid is used as the electrolyte.

The thickness of the silicon oxide film can be independently controlled for selected ones of the gate electrode and the wirings respectively. Namely, a voltage source may be connected only to some of the gate electrode and the wirings so that the rest are not oxidized. More generally, the gate electrode and the wirings are oxidized respectively in a variety of oxidation conditions by making connection of a respective one with the voltage source and applying a desired voltage and a desired current for a desired time. For example, a relatively thick film is desired when the oxide film is utilized as an interlayer insulating film whereas a thin film is desired when utilized as an insulator for a capacitance.

After the formation of the silicon oxide films on the gate electrode and the wirings in this manner, the wafer is removed from the solution and sufficiently dried. The quality of the silicon oxide film may be improved, if necessary, by applying hot water or by exposing it to high temperature steam. Namely, if the thickness of the silicon oxide film is relatively large, there are formed pores which are particularly significant in the case of wet anoding (wet anodic oxidation). The dielectric strength of such a porous film is not so large even if the thickness thereof is large. The pores may often form short current paths. In this case, the pores can be stopped by reaction of the silicon oxide with hot water or steam to form its hydrate. A dense silicon oxide film having sufficient insulating ability can be obtained by rinsing and drying the silicon oxide film given the hot water treatment in order that no electrolyte lingers. If an organic acid is used, the improvement of insulating ability is also made by baking the wafer at 200° to 1000° C. in an oxidizing atmosphere.

In the case of dry anoding (dry anodic oxidation), the semiconductor wafer is placed in a vacuum chamber. The vacuum chamber is then filled with an oxidizing gas such as $O_2$, $N_2O$, NO, $NO_2$ to an appropriate pressure. A DC or AC plasma is generated with connecting a voltage source with the gate electrode and the wirings as an anode and applying electric current.

Whereas a large number of semiconductor wafers can be treated at once by a relatively cheap device in the case of wet anoding, silicon oxide films thus formed are prone to movable ions such as sodium ions, which make submicron or quarter devices inoperative. On the other hand, whereas dry anoding is less advantageous than wet anoding to produce thick silicon oxide films in quantity, few contamination occur in the films which is desirable for miniaturized semiconductor devices.

The thickness of the silicon oxide film is determined to accomplish the task of the film for the required purpose. Since the film usually functions as an interlayer insulating film, the thickness is selected between 0.1 micrometer and 1.0 micrometer, more preferably between 0.2 micrometer and 0.5 micrometer. The thickness may be thereunder when it is not expected to function as an interlayer insulating film.

The gate electrode and the wirings are thus oxidized in this manner. The actual dimensions of the gate electrode and the wirings decrease as the surfaces thereof are oxidized. The geometrical relationship between the gate electrode and the impurity regions as the source and the drain can be appropriately adjusted by taking into consideration the thickness of the silicon oxide film formed on the gate electrode and the overlap between the impurity regions and the gate electrode. The thickness of the silicon oxide film can be controlled with an accuracy of 10 nm or less whereas the secondary scattering of ion implantation can be controlled also with the same order accuracy. By controlling the thickness of the film and the secondary scattering, the gate electrode and the impurity regions can be formed with no overlap as illustrated in FIG. 3(B), or if desired, with some overlap or with some distance between the edges of the electrode and the inner ends of the impurity regions.

Contact holes are opened through the oxide film 103 by photolithography or wet etching carried out by dipping the entirety of the wafer in a hydrofluoric acid. In the case of the wet etching, the field insulating films 102 and the anodic oxide films 107 and 108 are also etched together with the oxide film 103. Since the thicknesses of the field insulating films 102 and the anodic oxide films 107 and 108 are sufficiently large as compared with the thickness of the oxide film 103, however, there arises no problem. Finally, source and drain electrodes 111 and 112 are formed to make electrically contact with the source and drain regions 109 and 110. The source and drain electrodes 111 and 112 may be made from a metal such as aluminum, tungsten, a semiconductor such as silicon, or a silicide of tungsten, molybdenum or the like.

The source electrode 111, the drain electrode 112 or their extension may intersect with the wirings 105. In FIG. 3(C), the source electrode 111 is in contact with the silicon oxide film 108. There is no need to provide a particular insulating film between them since the external surface of the wirings is covered with the anodic oxide film. This is particularly effective because the steps between the oxide film 103 and the underlying substrate are very low, where the interconnections between the source and drain regions 106 and the source and drain electrodes 111 and 112 are made. Such steps would otherwise be tend to cause disconnection of the electrodes 111 and 112.

In the case that insulation by the silicon oxide films 107 and 108 is considered not to be sufficient, an interlayer insulating film may be provided in the same manner as the conventional technique. The thickness of the interlayer insulating film, however, can be half the usual thicknesses or less. Even if the total thickness of the oxide film 107 or 108 and the interlayer insulating film equals the conventional thickness, the height of the steps occurring at the peripheries of the contact holes of the source and drain regions is half the height of the conventional technique, and therefore disconnection of the source and drain electrodes is unlikely.

Furthermore, the problem arising from disparity in thickness of an interlayer insulating film in the conventional technique is overcome by the present invention. In the case of conventional technique, it is inevitable that the thickness of an interlayer insulating film is affected by unevenness of the underlying surface. Anoding, however, can grow silicon oxide uniformly anywhere electric current is supplied.

Namely, the yield of integrated circuits within a semiconductor substrate is substantially improved by the present invention. The method in accordance with the present invention is effective to reduce the likelihood of the conventional difficult trouble concerning short current paths between lower wirings such as a gate electrode and upper wirings such as source and drain electrodes, which trouble is sometimes the case because an interlayer insulating film interposing therebetween may be partially thin, particularly at the sides of the lower wirings where short current paths are often formed. This conventional trouble originates from the nature of CVD by which interlayer insulating films are formed over the lower wirings with thicknesses depending upon the geometry of the substrate. Contrary to this, in accordance with the present invention, the lower wirings are covered by an oxide film having a uniform thickness and a high dielectric strength. A thin interlayer insulating film may be coated over the anodic oxide film, if desired, in order to reinforce the insulation.

A step around a contact hole through which an upper wiring is electrically connected to the substrate may be a cause of fault formation such as disconnection. In accordance with the present invention, the height of a step is substantially reduced resulting in avoidance of troubles.

Furthermore, with regard to the configuration of a MOSFET itself, the spatial relationship between a gate electrode and impurity regions can be arbitrarily designed. For example, a LDD structure can be formed with high accuracy by a process which is very simple as compared with prior arts and can be carried out with few constraint on the aspect ratio of gate electrode. The present invention is believed to be effective to cope with the current increase in the aspect ratio of the gate electrode which is currently advanced along with miniaturization and the tendency of forming integrated circuits by single channel devices.

Of course, the present invention is applicable for devices provided with gate electrodes having an aspect ratio no higher than 1. In this case, the present invention is also advantageous because the formation of an insulating film and the anisotropic etching of the insulating film for forming spacers on the side surface of a gate electrode can be dispensed with.

In accordance with an aspect of the present invention, an oxide obtained by oxidizing the underlying metallization layer is used instead of a part or all of the interlayer insulator used in the prior art integrated circuit. Thus, the thickness of the interlayer insulator at the locations at which electrodes are formed is halved or reduced further. In consequence, the electrode portions are prevented from breaking.

The underlying metallization layer is oxidized as described above and acts like the spacers of the prior art lightly doped drain structure. Consequently, a lightly doped drain structure can be formed at a higher accuracy than conventional. In a MOS transistor having an ordinarily doped region other than the lightly doped drain structure, the relation between the gate electrode and the doped regions is optimized. This improves the operating characteristics of the transistor.

A typical semiconductor device (MOSFET) according to the invention is shown in FIGS. 7, (A)–(C). This FET comprises a gate electrode consisting principally of silicon and an oxide surrounding this electrode, as shown in FIG. 7(C). The oxide is formed by thermal oxidation.

The manner in which this MOSFET is fabricated is now described by referring to FIGS. 7, (A)–(C). First, a device-separating region (an oxide film for insulating an element) 702 is formed on a substrate 701 consisting of a single crystal of a semiconductor. A gate oxide film (gate insulating film) 703 having a thickness of 10 to 100 nm is formed on the exposed portion of the single crystal of the semiconductor by the prior art MOSFET fabrication techniques. A gate electrode 704 is formed from the aforementioned material on the gate oxide film (gate insulating film). At this time, a first conductive interconnection (wiring) 705 is formed on the device-separating region (field insulator). This interconnection (wiring) 705 is made of the same material as that of the gate electrode 704 and connected with the gate electrode. The interconnection 705 extends from the gate electrode or is formed as a conductive interconnection totally independent of the gate electrode. In this stage, the gate oxide film 703 remains, but it may be etched away simultaneously with the formation of the gate electrode. Using the gate electrode and the device-separating region as a mask, doped regions 706 are formed by ion implantation or plasma doping in the same way as in the conventional process. Since the dopant atoms go a long way around, the doped regions slightly overlap the gate electrode. If the doped regions are formed by ion implantation, the overlap is caused by secondary scattering of the ions and, therefore, the dimension of the overlap can be calculated, taking account of the energy of the implanted ions and other factors. In this way, the laminate shown in FIG. 7(A) is obtained.

Then, the surfaces (the upper surfaces and the side surfaces) of the gate electrode and of the first conductive interconnection are oxidized by thermal oxidation. The upper surface and the side surface of the gate electrode is covered with a layer 707 comprising oxide, e.g. silicon oxide, by the oxidation. The first conductive interconnection is also covered with a layer comprising oxide, e.g. silicon oxide, by the oxidation. It is inevitable that the device-separating region and the gate oxide film are also oxidized. In the present invention, it is required that the increase in the thickness of these portions due to the thermal oxidation be smaller than the thickness of the oxide film formed on the surface of the first conductive interconnection. Fortunately, the increase in the thickness is sufficiently small, since these portions have been already coated with a film of silicon oxide.

More specifically, the rate at which silicon is oxidized decreases with increasing the thickness of the oxide film previously formed. Generally, it is known that the following equation holds for the thermal oxidation of silicon:

$$x^2 - x_0^2 + Ax - Ax_0 = Bt \tag{1}$$

where A and B are positive constants depending on silicon and silicon oxide, respectively, and are affected by temperature, the plane orientation of silicon, the rates at which oxygen atoms and water respectively diffuse through silicon, and other factors; $x_0$ is the thickness of the silicon oxide film previously formed; and x is the thickness of the silicon oxide when time t has elapsed. By modifying equation (1), we have $$x(x + x_0 + A) = Bt(\Delta x = x - x_0) \tag{2}$$

Where almost no silicon oxide is formed on the surface, $x_0 = 0$. Thus, $$x_1 = Bt/(x+A) \tag{3}$$

Where a considerably thick film has been already formed and the relation $x \sim x_0$ holds, we get $$x_2 = Bt/(2x+A) \tag{4}$$

It can be seen from equations (3) and (4) that the oxidation rate (given by $\Delta x/t$) is higher where no silicon oxide film has existed provided that the other conditions are the same. Roughly, the difference is given by $$\Delta x_1/\Delta x_2 = (2x+A)/(x+A) < 2$$

In practice, when (100) plane of a single crystal of silicon is oxidized at 1000° C. for 100 minutes by thermal oxidation within dry oxygen at 1 atm., a film of silicon oxide 100 nm thick is formed if no silicon oxide is formed on the surface prior to the thermal oxidation. On the other hand, if a film of silicon oxide 100 nm thick is formed on the surface prior to the thermal oxidation, the thickness of the film of silicon oxide is only 150 nm. In the former case, the thickness of the formed silicon oxide film is 100 nm, but in the latter case, the thickness of the newly formed silicon oxide film is only 50 nm, although the oxidation time is the same for both cases.

When thermal oxidation is carried out at 900° C. for 100 minutes, if film of silicon oxide is not formed before the thermal oxidation, then a film of silicon oxide having a thickness of 50 nm is formed. When a film of silicon oxide having a thickness of 50 nm is formed prior to the thermal oxidation, the thickness of the added silicon oxide film is only 20 nm. Even with a thermal treatment for 200 minutes, if film of silicon oxide does not exist prior to the thermal oxidation, then a film of silicon oxide 70 nm thick is formed as a result of the thermal oxidation. On the other hand, when a film of silicon oxide 90 nm thick is formed prior to the thermal oxidation, the thickness of the added film of silicon oxide is only 30 nm.

Furthermore, the thermal oxidation rate differs greatly among plane orientations. The oxidation rate at (100) plane of silicon is smaller than the oxidation rates at other planes such as (111) plane. Since the surface of a polysilicon crystal have random plane orientations, the oxidation rate at the (100) plane is higher as a matter of course. The surface is oxidized at an approximately doubled speed. Accordingly, where only the gate electrode and the first conductive interconnection should be positively oxidized as in the present invention, these electrode and interconnection are made of polysilicon. The substrate is made of the (100) plane of a single crystal of silicon.

As an example, when the (100) plane of a single crystal of silicon coated with a film of silicon oxide 100 nm thick is oxidized by thermal oxidation at 1000° C. for 100 minutes within dry oxygen at 1 atm., the thickness of a newly formed film of silicon oxide is only 50 nm. When a film of polysilicon having no oxide on the surface is oxidized under the same conditions, an oxide film as thick as 200 nm is formed on the surface.

When thermal oxidation is done similarly at 900° C. for 100 minutes, if a film of silicon oxide having a thickness of 50 nm is formed before the thermal oxidation, the thickness of the increased silicon oxide is only 20 nm. A film of silicon oxide having a thickness of 100 nm is formed on polysilicon. On the other hand, when thermal treatment is made for 200 minutes, if a film of silicon oxide 90 nm thick is formed before the thermal oxidation, then the thickness of the increased silicon oxide is only 30 nm. However, a film of silicon oxide grows on the surface of polysilicon to a thickness of 140 nm.

For these reasons, the silicon oxide formed at the position at which a gate electrode will be formed is much thicker than a newly formed film of silicon oxide on the silicon substrate through the gate-insulating film, as shown in FIG. 7. The roughness of the surface of the silicon substrate is sufficiently small. For instance, when a polysilicon region 704 becoming the gate electrode is oxidized to a thickness of 100 nm from the original surface, the silicon substrate under the silicon oxide film 703 is further oxidized 25 nm. The roughness to this extent does not materially affect the characteristics of the semiconductor device.

The thicknesses of the films of silicon oxide 707, 708 formed in this way must be determined according to the purpose. Usually, these films are expected to serve as interlayer insulating films. Therefore, their thicknesses are 0.1 to 1.0 μm, preferably 0.2 to 0.5 μm. However, where it is not expected so much that they act as interlayer insulating films, less thicknesses are possible.

By the method described above, the surfaces of the gate electrode and of the first conductive interconnection are oxidized. At the same time, the surfaces of the gate electrode and of the conductive portion of the first interconnection retreat. At this time, the positional relation between the gate electrode and the doped regions is made optimum by considering the thickness of the oxide layer 707 on the gate electrode and the non-alignment of the doped regions into account. In particular, the thickness of the oxide layer can be controlled to tolerances less than 10 nm by controlling the thermal oxidation temperature and the thermal oxidation time. Also, the secondary scattering of ions which occur during ion implantation can be only 30 nm. However, a film of silicon oxide grows on the surface of polysilicon to a thickness of 140 nm.

For these reasons, the silicon oxide formed at the position at which a gate electrode will be formed is much thicker than a newly formed film of silicon oxide on the silicon substrate through the gate-insulating film, as shown in FIG. 7. The roughness of the surface of the silicon substrate is sufficiently small. For instance, when a polysilicon region 704 becoming the gate electrode is oxidized to a thickness of 100 nm from the original surface, the silicon substrate under the silicon oxide film 703 is further oxidized 25 nm. The roughness to this extent does not materially affect the characteristics of the semiconductor device.

The thicknesses of the films of silicon oxide 707, 708 formed in this way must be determined according to the purpose. Usually, these films are expected to serve as interlayer insulating films. Therefore, their thicknesses are 0.1 to 1.0 μm, preferably 0.2 to 0.5 μm. However, where it is not expected so much that they act as interlayer insulating films, less thicknesses are possible.

By the method described above, the surfaces of the gate electrode and of the first conductive interconnection are oxidized. At the same time, the surfaces of the gate electrode and of the conductive portion of the first interconnection retreat. At this time, the positional relation between the gate electrode and the doped regions is made optimum by considering the thickness of the oxide layer 107 on the gate electrode and the non-alignment of the doped regions into account. In particular, the thickness of the oxide layer can be controlled to tolerances less than 10 nm by controlling the thermal oxidation temperature and the thermal oxidation time. Also, the secondary scattering of ions which occur during ion implantation can be controlled to similar tolerances. Therefore, the positional relation can be adjusted to tolerances less than 10 nm. In this way, the gate electrode and the doped regions can be formed without overlap as shown in FIG. 7, they can be formed so as to overlap each other over an appropriate distance, or they can be formed so as to be spaced from each other by an appropriate distance. Of course, an oxide film is formed around the first conductive interconnection 708 by this oxidation. This condition is shown in FIG. 7(B).

Finally, windows 709 and 710 are formed in the source and drain regions, respectively, and a source electrode and a source interconnection 711 and a drain electrode and a drain interconnection 712 are formed. It is not necessary to use any mask in forming these windows for the electrodes if the oxide 702 in the device-separating region and the oxides 707, 708 are sufficiently thicker than the gate oxide film 703. In this case, it only suffices to perform uniform etching, and one photolithography step which will deteriorate the production yield can be omitted.

When conductive interconnections (wirings) extending from the source and drain regions are formed on the first conductive interconnection, these interconnections (referred to as the second conductive interconnections) may intersect the first conductive interconnections. The conductive interconnection 711 is in contact with the layer 708. Since the first conductive interconnections are coated with an oxide film which is excellent in electrical insulation, it is not necessary to form a separate interlayer insulator. With respect to the portions connected with the doped regions, breaking of conductive interconnects and other faults can be reduced greatly, since the resulting steps are much smaller than steps formed conventionally. The second conductive interconnections may be made of a metal such as aluminum or tungsten, a semiconductor material such as silicon, or an alloy of silicon with tungsten or molybdenum.

Where the oxide layers 707 and 708 are considered to function unsatisfactorily as interlayer insulators, another interlayer insulator made of a conventional material can be formed on these oxide films. The thickness of the newly formed interlayer insulator can be made half or less compared with the thickness of the conventionally used interlayer insulator. More specifically, an insulator of a considerable thickness has been formed on the first electrode and so the added interlayer insulator can be thin. As a result, if the thickness of the added interlayer insulator is made half of the thickness of the conventional interlayer insulator, the steps at the electrode portions in the doped regions are roughly halved. Again, breaking of conductive interconnects and other faults can be reduced.

The thickness of the interlayer insulator formed by the prior art method is not uniform due to the unevenness of the underlying layer. In some locations, the interlayer insulator does not cover the underlying layer at all, causing a trouble. The oxide formed by thermal oxidation is uniform around the conductive interconnections and, therefore, such a trouble is not induced.

Various structures of MOSFETs can be fabricated by skillfully utilizing such an anodic oxide. We give some examples below.

FIG. 8 illustrates another example of the invention. First, as shown in FIG. 8(A), a device-separating region 802, a gate-insulating film 803, and a gate electrode 804 are formed over a semiconductor substrate 801. Unlike the method illustrated in FIG. 7, thermal oxidation is done prior to the formation of doped regions as shown in FIG. 8(B), thus forming an oxide 805. Then, as shown in FIG. 8(C), ions are implanted to form doped regions 806. At this time, the doped regions do not overlap the gate electrode; rather they are spaced from each other by a distance of L. This condition is herein referred to as the offset condition. It is known that the number of injected hot electrodes is reduced under the offset condition and that an effect similar to the effect produced when a lightly doped drain structure is formed is obtained. Our research has demonstrated that if the length L is set to 0.1 to 0.5 μm, then desirable results arise. Since the length L varies, depending on the thickness of the oxide 805 and on the energy of the injected ions, the desired amount can be derived by optimizing these parameters.

FIG. 9 illustrates a sequence in which a lightly doped drain structure is formed by the novel method. First, as shown in FIG. 9(A), doped regions 905 are formed in the same way as in the prior art process. The dopant concentration in these doped regions is $1 \times 10^{17}$ to $5 \times 10^{18}$ atoms/cm$^3$, preferably $5 \times 10^{17}$ to $2 \times 10^{18}$ atoms/cm$^3$. Then, as shown in FIG. 9(B), the gate electrons is oxidized by thermal oxidation to form an oxide 906. Finally, as shown in FIG. 9(C), ions are again implanted to form doped regions 907. The dopant concentration in these doped regions is $1 \times 10^{19}$ to $5 \times 10^{21}$ atoms/cm$^3$, preferably $5 \times 10^{19}$ to $2 \times 10^{21}$ atoms/cm$^3$. In this way, lightly doped regions 905' are formed. It is to be noted that the width of the lightly doped drain regions is not limited by the height of the gate electrode but determined by the thickness of the oxide 906. Therefore, the height of the gate electrode can be made sufficiently large, and the channel length can be made sufficiently small. That is, the aspect ratio of the gate electrode can be increased sufficiently.

Furthermore, the width of the lightly doped drain regions can be controlled quite accurately. For example, the width can be varied at will from 10 nm to 0.1 μm. In addition, the overlap between the gate electrode and the lightly doped drains can be controlled to similar tolerances as described previously. Under this condition, the channel length can be reduced below 0.5 μm. It is quite difficult to reduce the width of the lightly doped drain regions below 100 nm by the prior art method. Errors on the order of 20% have been customary. By exploiting the present invention, the lightly doped drain regions can be formed to tolerances on the order of 10% where the width is from 10 to 100 nm.

Additionally, in accordance with the present invention, it is not necessary to form an insulating coating becoming spacers. Hence, the process is simpler than the prior art process. Also, the productivity is improved. The thickness of the oxide formed by thermal oxidation is uniform at every position, including on the side surfaces and on the top surface. The thickness is, therefore, quite uniform, and the oxide is excellent in electrical insulating characteristics. We have not observed that the thickness differs from location to location over the substrate. Therefore, this oxide can be used as an interlayer insulator in the same way as in the case of FIG. 7. Of course, a separate interlayer insulator can be formed.

FIG. 10 illustrates an example in which the present invention is combined with laser annealing. First, as shown in FIGS. 10, (A)–(C), a device-separating region 1002, a gate oxide film 1003, a gate electrode 1004, an oxide 1005, and doped regions 1006 are formed over a substrate 1001 of a single crystal by the method illustrated in FIG. 8. Instead, the steps illustrated in FIG. 7 may be employed. In this stage, the doped regions are made amorphous or consist of crystallites due to the bombardment of implanted ions.

Finally, laser radiation or equivalent intense electromagnetic waves are illuminated from above to recrystallize the doped regions that are not in good crystal condition.

However, the gate electrode and the surrounding oxide block the laser radiation and so the portion located under the oxide 1005 is not recrystallized. The doped regions 1006 and the gate electrode can be positioned so as to hardly overlap each other, can be spaced a given distance from each other, or can be caused to overlap each other by the means described above. In this manner, an n-type (p-type) source region—n-type (p-type) amorphous region—p-type (n-type) channel formation region—n-type (p-type) amorphous region—n-type (p-type) drain region structure or an n-type (p-type) source region—n-type (p-type) amorphous region—p-type (n-type) offset region—p-type (n-type) channel formation region—p-type (n-type) offset region—n-type (p-type) amorphous region—n-type (p-type) drain region structure is obtained. Only one ion implantation step is needed in fabricating such a structure. This structure yields the same advantages as the lightly doped drain structure, as described in Japanese Patent Application No. 238713/1991 filed by the present applicant.

In the present invention, the oxide formed on the gate electrode and on the first conductive interconnections can be used as an interlayer insulator as described above. The invention is not restricted to this purpose. For example, the invention can be used to position the gate electrode and the doped regions in an accurate relation or to obtain the structures shown in FIGS. 8, 9, 10. In these cases, the sizes and the positions of these special doped regions are determined by the thickness of the oxide layer. Therefore, the obtained interlayer is not always appropriate. In this case, a separate interlayer insulator must be formed by the conventional method, and the steps on the electrode formation portions are the same as conventional steps.

As described already, the present invention permits various structures of MOSFETs to be fabricated without needing special techniques or complex steps. It is to be understood that the present invention is based on thermal oxidation of gate electrodes. A specific example of the invention is given below. Also, the advantages will be described.

In accordance with another aspect of the present invention, an oxide film having the same quality as an anodic oxidation film formed in an electrolyte is formed on a gate electrode or a gate interconnection in a plasma by applying a positive bias to the gate interconnection. That is, the plasma is generated by applying a d.c. electric field or an alternating electric field (including a high frequency electric field and a microwave electric field) to an atmosphere comprising an oxygen atom, oxygen molecule, ozone molecule or active one thereof. A substrate is exposed to the plasma while a lead wire such as a gate interconnection provided on the substrate is applied to a positive bias.

The substrate is maintained at a temperature from room temperature to 500° C., preferably room temperature to 300° C. The applied bias should be varied in accordance with thickness of an oxide to be formed on a surface of the lead wire. An optimum voltage may be determined by monitoring a current flowing in the lead wire. Too large voltage is not preferable since an abnormal increase of temperature of the lead wire and a plasma impact is caused by application of such too large voltage, and an abnormal distribution of plasma is also caused.

A typical example of the present invention is shown in FIG. 11. A semiconductor device (TFT) in accordance with the present invention is shown in FIG. 11(D). A metal, for example titanium (Ti), aluminum (Al), tantalum (Ta), chromium (Cr), or an alloy thereof, can be used as a gate electrode material. An oxide surrounding the gate electrode-can be selectively formed by anodic oxidation.

A method for manufacturing such a TFT is described below referring to FIG. 11. First, semiconductor films 1103 and 1104 are formed directly on an insulating substrate 1101 or on a base insulating film 1102 formed on a substrate as shown in FIG. 11. An insulating film 1105 comprising a gate insulator is formed on the semiconductor films to a thickness of 10 to 200 nm. Gate electrodes 1106 and 1107 are formed on the insulating film 1105 from the above-mentioned material. At the same time with the formation of the gate electrodes 1106 and 1107, a wiring comprising the same material as the gate electrodes 1106 and 1107 is formed on the substrate as a wiring extending from the gate electrode or a wiring independent of the gate electrode. At this stage, the gate oxide film 1105 remains in FIG. 11. However, it may be etched off at the same time with the formation of the gate electrodes.

Then, an anodic oxidation films 1108 and 1109 are formed around the gate electrode and the gate interconnection as shown in FIG. 11(B). The formation is carried out as follows. First, a substrate is provided in a vacuum chamber and an oxidizing gas, e.g. oxygen or nitrogen oxide such as $N_2O$, NO and $NO_2$, is introduced into an inside of the vacuum chamber to provide an oxidizing atmosphere therein. The gate electrode or the gate interconnection is connected with a power source and supplied with a positive voltage. An electric field is applied to the oxidizing atmosphere and a d.c. or alternating plasma is produced at an appropriate pressure (e.g. a reduced pressure) to perform anodic oxidation of surfaces of the gate electrode and the gate interconnection. Thickness of the anodic oxidation film should be determined according to purpose. In the case where the anodic oxidation film functions as an interlayer insulating film, the thickness is 0.1 to 1.0 μm. preferably 0.2 to 0.5 μm. The thickness may be smaller for other purpose.

Then, impurity regions 1110 to 1113 are formed in a self-aligned manner by ion implantation or plasma doping with the gate electrodes and the anodic oxidation films as masks as shown in FIG. 11(C). Finally, an interlayer insulator 1114 is deposited and contact holes are formed therein on the impurity regions, and electrodes and interconnections 1115 to 1117 are formed.

Width of offset can be subtly controlled according to the present invention. For example, it can be arbitrarily varied from 10 nm to 0.1 μm. 0.5μ or shorter of channel length is possible in this case. It is possible in the present invention to form an offset at a width of 10 to 100 nm at about 10% in error.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 1:
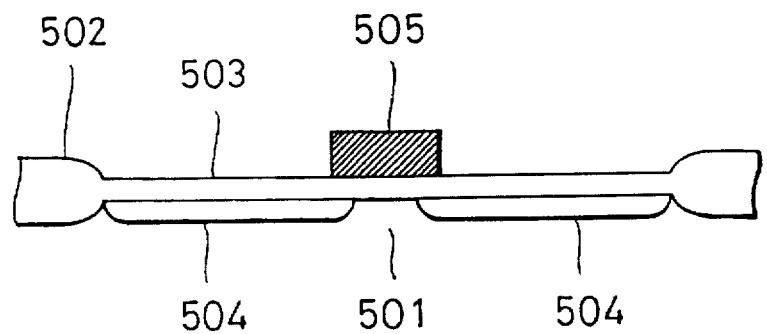
FIGS. 1(A) to 1(C) are cross sectional views showing a conventional method of manufacturing a field effect transistor.
Figure 1:
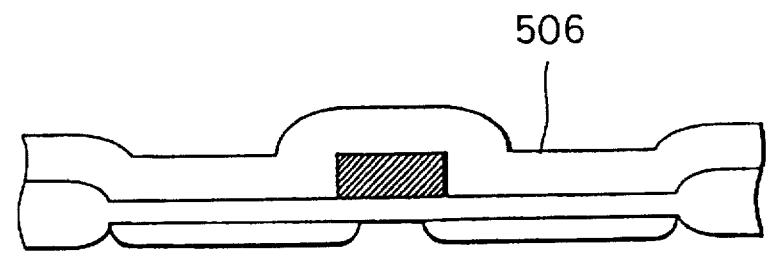
Figure 1:
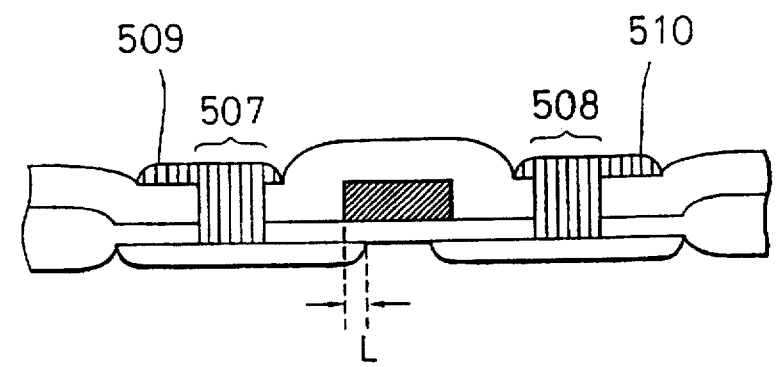
Figure 2A:
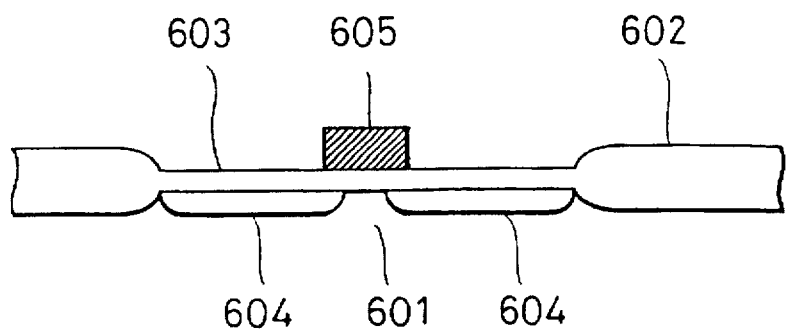
FIGS. 2(A) to 2(D) are cross sectional views showing another conventional method of manufacturing a field effect transistor.
Figure 2B:
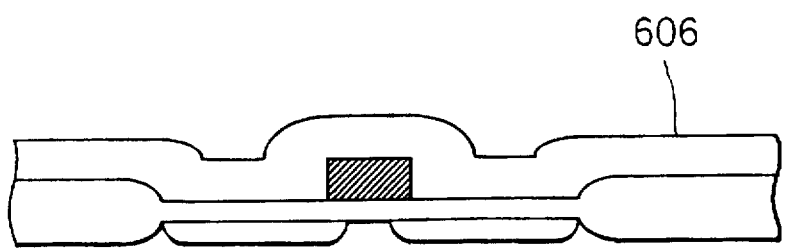
Figure 2C:
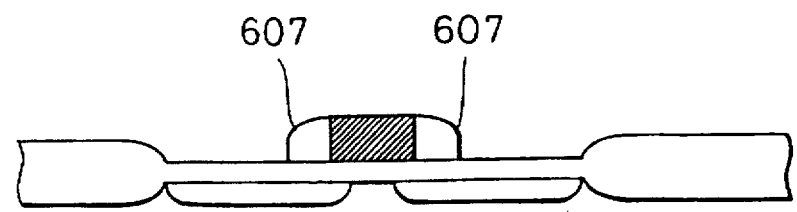
Figure 2D:
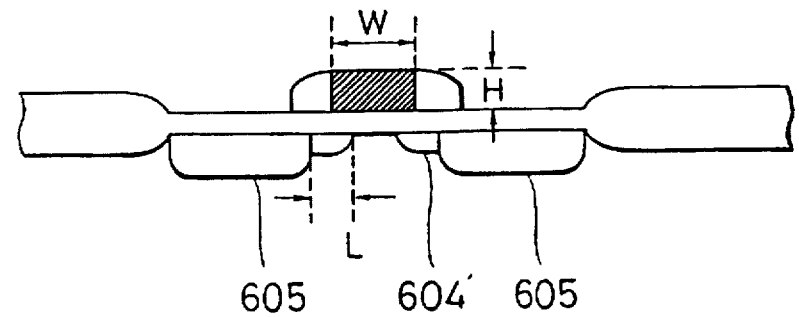

Referring again to FIGS. 3(A) to 3(C), a method of manufacturing a semiconductor integrated circuit with an n-channel field effect transistor within a p-type silicon semiconductor substrate in accordance with a first embodiment of the present invention will be explained in details.

Field insulating films 102 are formed on a p-type single crystal silicon semiconductor 101 in order to define an active region therebetween by the so-called LOCOS technique. The impurity density of the semiconductor substrate is on the order of about $10^{15}$ cm$^{-3}$. Although not shown in the figure, p$^+$-type channel stoppers are formed just below the field insulating films 102 at the same time by selective ion implantation with $BF_2^+$. The active region between the field insulating films 102 is coated with a gate insulating film 103 of a thickness of 30 nm by thermal oxidation.

A polysilicon (polycrystalline silicon) film doped with phosphorus at $0.8\times10^{20}$ to $1.5\times10^{20}$ cm$^{-3}$ is deposited to a thickness of 500 nm by thermal CVD and patterned by etching in order to provide a gate electrode 104, a gate wiring integrally extending from the gate electrode and other necessary wirings as designated by numeral 105. In FIG. 3, the field insulator 102 is provided between the semiconductor substrate 101 and the gate wiring 105. Arsenic ions are introduced to the semiconductor substrate by ion implantation with the gate electrode as a mask in order to form n$^+$ type impurity regions 108 as source and drain regions having a doping concentration of $0.2\times10^{20}$ to $0.9\times10^{20}$ cm$^{-3}$ in a self-alignment fashion. The impurity regions 106 have a depth of 100 nm and are made active by subsequent thermal annealing at 900° C. for an hour.

Figure 3A:
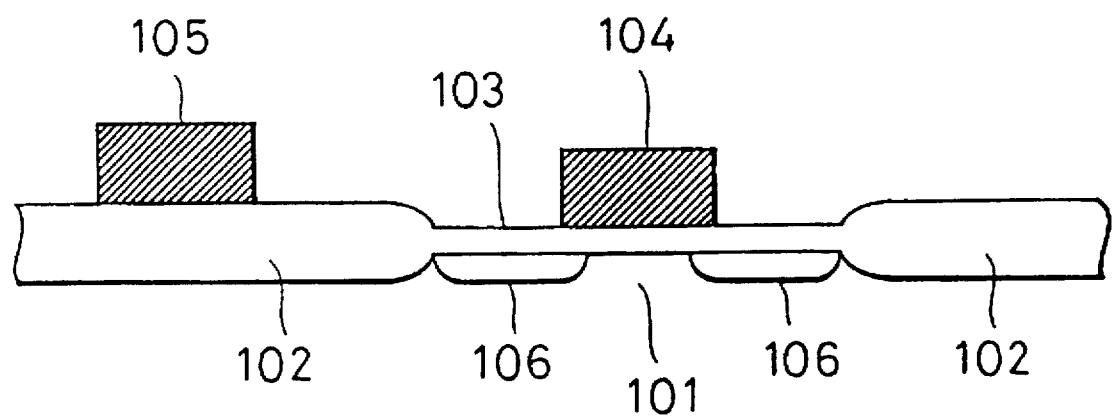
FIGS. 3(A) to 3(C) are cross sectional views showing a method of manufacturing a semiconductor integrated circuit having a field effect transistor in accordance with a first embodiment of the present invention.
Figure 3B:
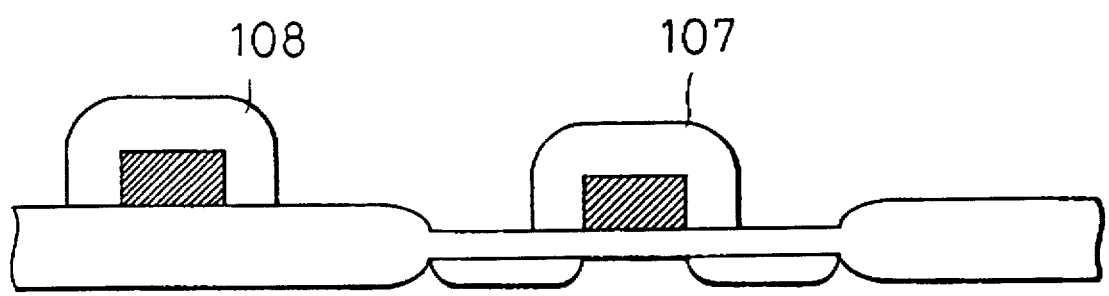
Figure 3C:
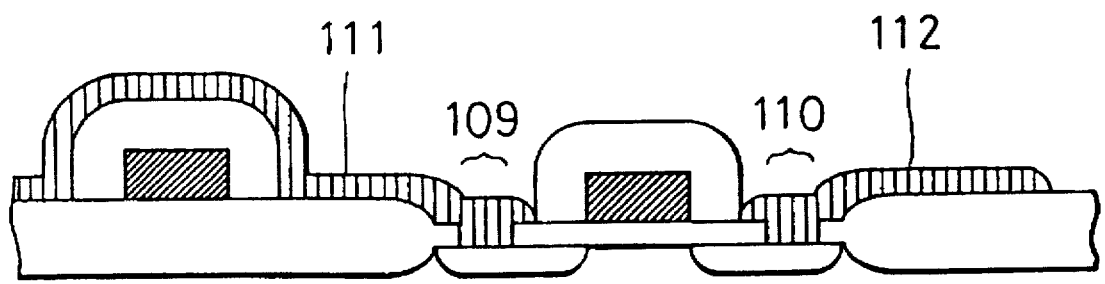

Next, as illustrated in FIG. 3(B), the external surfaces of the gate electrode 104 and the wiring 105 are anodic oxidized in order to form silicon oxide films 107 and 108. The process of the anodic oxidation will be explained later in details. Contact holes are opened through the oxide film 103 by photolithography or wet etching carried out by simply dipping the entirely of the wafer in a hydrofluoric acid. In the case of the wet etching, the field insulating films 102 and the anodic oxide films 107 and 108 are also etched together with the oxide film 103. Since the thicknesses of the field insulating films 102 and the anodic oxide films 107 and 108 are sufficiently large as compared with the thickness of the oxide film 103, however, there arises no practical problem. Whereas the yield is improved in this case because no mask is used, the wet process is prone to alkali ion contaminations. Lastly, an aluminum or tungsten film is coated over the structure and patterned to form a source electrode and a lead wiring extending therefrom 111 and a drain electrode and a lead wiring 112 extending therefrom as illustrated in FIG. 3(C). As a result, a field effect transistor is formed together with associated wirings.

The anodic oxidation of the gate electrode 104 and the wiring 105 is carried out by wet anoding (wet anodic oxidation) or dry anoding (dry anodic oxidation). The wet anoding is carried out in the following manner. The numerical values employed here are only exemplary and therefore optimum values must be particularly selected in accordance with the actual circuit design and the size of the wafer. First, an ethylene glycol solution of tartaric acid is prepared in order that no alkali ion is detected therefrom. The concentration of tartaric acid in the electrolyte is 0.1 to 10 wet %, for example, 3%, and its pH is controlled to be 7.0±0.5, for example, by suitably adding ammonia of 10 wet % thereto. A 20 mA DC current is passed through the electrolyte with the gate electrode and the wirings 104 and 105 on the substrate entirely dipped therein as a positive electrode and a platinum plate as a negative electrode to perform anodic oxidation. The anodic oxidation is continued with the constant current of 2 mA whereas the voltage between the positive and negative electrode is increased because the growth of the oxide films formed on the gate electrode and the wirings 104 and 105 causes shrinkage of the gate electrode proper during anoding (anodic oxidation) to increase the resistance of the current path. After the voltage reaches to 150V, the oxidation is further continued but in this time with the voltage being maintained at 150V until the current is reduced to 0.1 mA. The anoding with the constant current continues for about 50 minutes followed by the anoding with the constant voltage for about 2 hours. Then, the oxide films 107 and 108 are grown to a thickness of 0.3 to 0.5 micrometer on the external surfaces of the gate electrode and the wirings 104 and 105.

The oxide films 107 and 108 thus formed are sufficiently dense. In order to further increase the insulating ability, however, the oxide films 107 and 108 may be dipped in a hot water for 10 minutes to close fine apertures or pores thereof by converting silicon oxide into its hydrate. The structure is then heated at 200° to 800° C., preferably at 250° to 500° C., for 1 to 10 hours to perform dehydration. The films 107 and 108 made of dried silicon oxide are no longer observed with fine apertures or pores. By this procedure, the withstand voltage of the films is improved to 6 to 30 MV/cm.

In the case utilizing the dry anoding, the oxide films 107 and 108 are formed in the following manner. The silicon wafers formed with the structure as illustrated in FIG. 3(A) are placed in a vacuum chamber. The chamber is then filled with oxygen introduced at 50 SCCM to a pressure of 50 Torr, followed by causing electric discharge. The discharge may be DC discharge (1 to 8 kV), AC plasma discharge (5 to 1000 Hz), high frequency plasma discharge (1 kHz to 100 MHz) or microwave plasma discharge (100 MHz to 100 GHz). In this case, the silicon wafer has to be located as an anode in the vicinity of the plasma and a positive bias voltage of several volts or several tens of volts is applied to the gate electrode and the wirings 104 and 105 whereas the vacuum chamber is ground. In this condition, the gate electrode and the wirings 104 and 105 are anodic oxidized to form the oxide films 107 and 108 at 10 nm/min to 0.3 to 0.5 micrometer thickness. The silicon oxide films thus formed by the dry anoding are very smooth and dense, and even by the use of a microscope there is observed no particular structure in their surfaces. The withstand voltage of the films is as high as 10 MV/cm or higher even without the hot water treatment.

Figure 4:
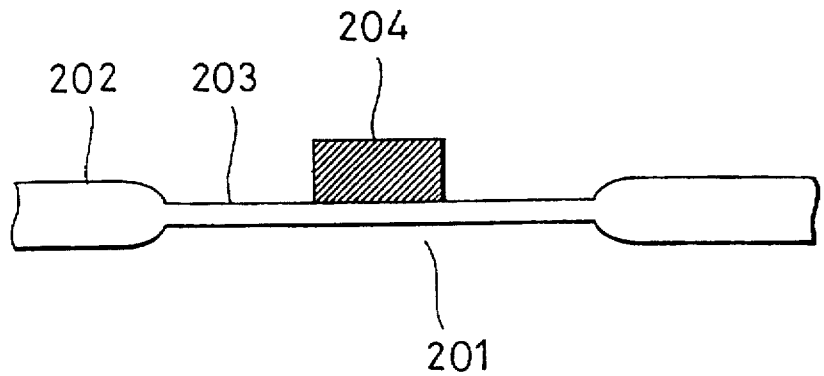
FIGS. 4(A) to 4(C) are cross sectional views showing a method of manufacturing a semiconductor integrated circuit having a field effect transistor in accordance with a second embodiment of the present invention.
Figure 4:
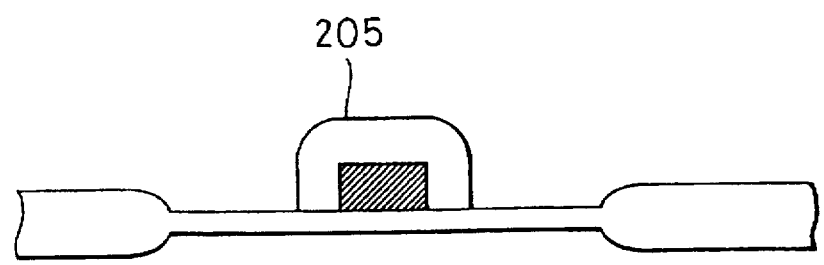
Figure 4:
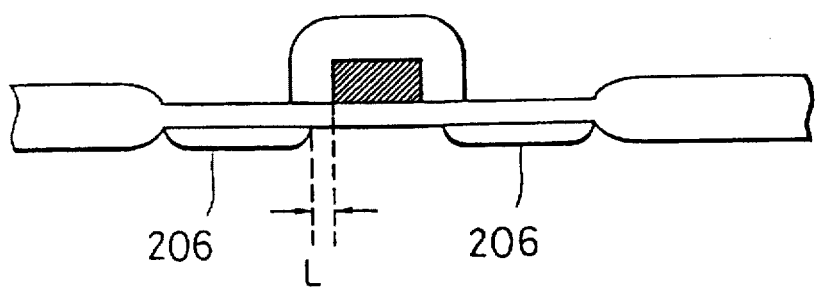

FIGS. 4(A) to 4(C) are cross sectional views showing a field effect transistor in accordance with a second embodiment of the present invention. Field insulating films 202 and a gate electrode insulated from a semiconductor substrate 201 by a gate insulating film 203 are formed in the same manner as in the first embodiment. Next, the gate electrode 204 is anodic oxidized by the same process as employed in the first embodiment but in advance of formation of impurity regions as illustrated in FIG. 4(B). Impurity regions 206 are then formed by ion implantation with the anodic oxidized gate electrode as a mask. The inner ends of the impurity regions 206 are thus not overlapping with the gate electrode but set back from the perimeter of the gate electrode by distance "L" (offset condition). It has been well known in the art that the offset condition has same effects as the LDD structure. In accordance with research by the inventors, it has been discovered that the optimum value of the distance "L" depends on the thickness of the anodic oxide film, the acceleration energy of ion implantation and so forth and are preferably selected between 0.1 micrometer and 0.5 micrometer in many cases. Although dispensed with in the figures, the formation of anodic oxide films on other wirings and provision of source and drain electrodes thereover are performed in the same manner as in the first embodiment.

Figure 5A:
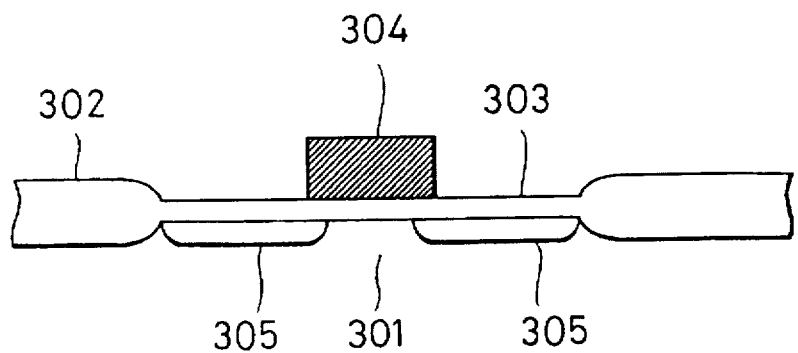
FIGS. 5(A) to 5(C) are cross sectional views showing a method of manufacturing a semiconductor integrated circuit having a field effect transistor with LDD regions in accordance with a third embodiment of the present invention.
Figure 5B:
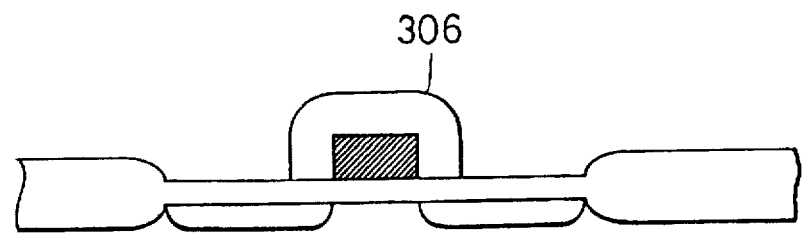
Figure 5C:
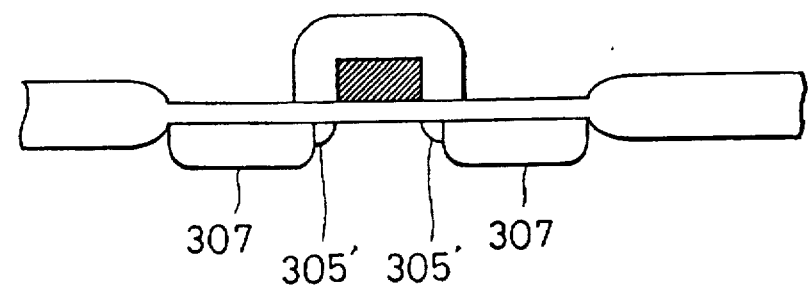

FIGS. 5(A) to 5(C) are cross sectional views showing a semiconductor integrated circuit with a field effect transistor having the LDD structure in accordance with a third embodiment of the present invention. First, field insulating films 302 and a gate electrode insulated from a p⁻-type semiconductor substrate 301 by a gate insulating film 303 are formed in the same manner. Lightly doped impurity regions 306 are formed by implantation of arsenic ions with the gate electrode 304 as a mask. The impurity region 304 are extending inwardly beyond the periphery of the gate electrode 304. The impurity concentration of the impurity regions 305 is $1 \times 10^{17}$ cm$^{-3}$ to $5 \times 10^{18}$ cm$^{-3}$ preferably $5 \times 10^{17}$ cm$^{-3}$ to $2 \times 10^{18}$ cm$^{-3}$. The gate electrode 304 is then anodic oxidized to form an oxide film 306. Arsenic ions are introduced again into the semiconductor substrate by ion implantation to an impurity concentration of $1 \times 10^{19}$ cm$^{-3}$ to $5 \times 10^{21}$ cm$^{-3}$, preferably $5 \times 10^{19}$ cm$^{-3}$ to $2 \times 10^{21}$ cm$^{-3}$, with the anodic oxidized gate electrode as a mask to form heavily doped impurity regions 307, leaving inner portions of the lightly doped regions 305 as LDD regions 305' located inside of the heavily doped regions 307. Although dispensed with in the figures, the formation of anodic oxide films on other wirings and provision of source and drain electrodes thereover are performed in the same manner as in the first embodiment.

It should be noted in the third embodiment that the width of the LDD regions 305' is not determined by the height of the gate electrode but only depends on the thickness of the anodic oxide film 306. Accordingly, it is possible to sufficiently increase the height of the gate electrode, sufficiently decrease the channel length and therefore increase the aspect ratio of the gate electrode.

Furthermore, in accordance with the present invention, the width of the LDD regions can be arbitrarily controlled with extremely high accuracy, e.g. from 10 nm to 0.1 micrometer. The overlapping width of the LDD regions and the gate electrode can be controlled with the same accuracy. The channel length no longer than 0.5 micrometer is possible in this case. By conventional techniques, it is very difficult to control the width of LDD regions of no larger than 100 nm within 20% dispersion. The dispersion of the width of LDD regions is about 10% when the width is designed between 10 to 100 nm in accordance with the present invention. Still further, the process of forming the LDD structure is very simple as compared with conventional techniques, resulting in high yields. The quality and the thickness of the anodic oxide film is very uniform both at the side surface and at the top surface of the gate electrode. The insulating characteristic of the oxide film is excellent.

Figure 6A:
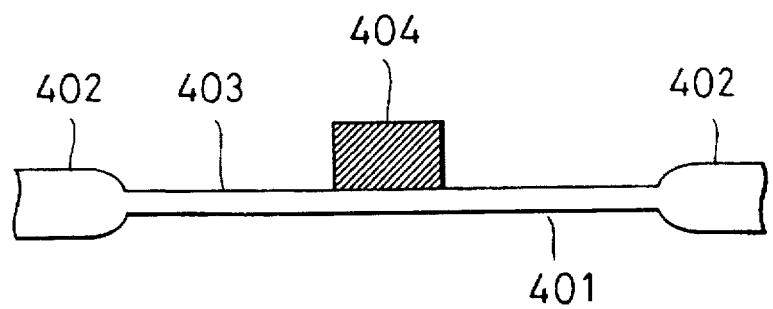
FIGS. 6(A) to 6(D) are cross sectional views showing a method of manufacturing a semiconductor integrated circuit having a field effect transistor with a new structure equivalent to LDD regions in accordance with a fourth embodiment of the present invention.
Figure 6B:
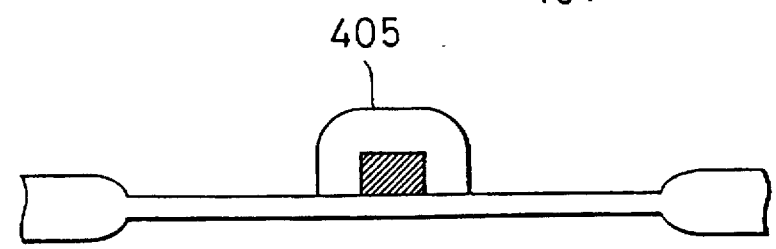
Figure 6C:
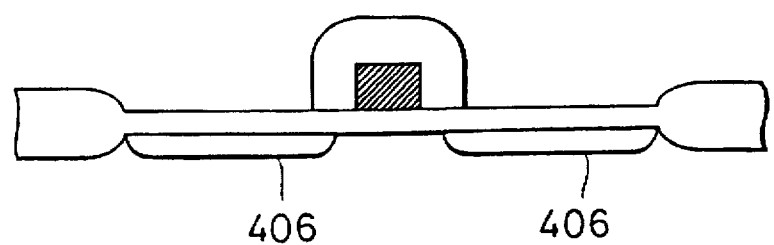
Figure 6D:
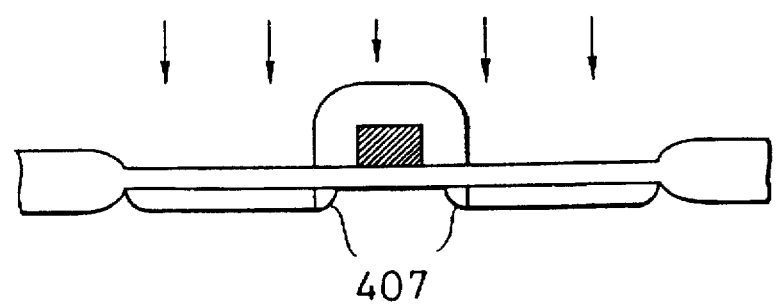

Referring now to FIGS. 8(A) to 8(D), an embodiment utilizing a laser annealing technique in accordance with a fourth embodiment of the present invention will be explained. Field insulating films 402, a gate insulating film 403, a gate electrode 404, an anodic oxide film 405 and impurity regions 406 are formed in the same manner as the second embodiment. FIGS. 6(A) to 6(C) correspond to FIGS. 4(A) to 4(C) and redundant description will be dispensed with. The impurity regions 406 have an amorphous or microcrystalline structure because of the ion bombardment. The impurity regions 406 are then exposed to laser rays or equivalent high energy electromagnetic waves which are directed from above with the gate electrode 404 and the oxide film 405 as a mask in order to recrystallize the impurity region 406. Because of the existence of the mask, inside portions 407 of the impurity regions 406 just under the gate electrode 404 and the oxide film 405 are not recrystallized. The spatial relationship between the gate electrode and the inside portions 407 can be arbitrarily controlled as explained above in order that they overlap for a desired width, that the ends thereof are just aligned or that they are located apart from each other by a desired distance as the case illustrated. Accordingly, formed by this process is a structure consisting of n-type (p-type) source region—n-type (p-type) amorphous region—p-type (n-type) channel region—n-type (p-type) amorphous—n-type (p-type) drain region or a structure consisting of n-type (p-type) source region—n-type (p-type) amorphous region—p-type (n-type) offset region—p-type (n-type) channel region—p-type (n-type) offset region—n-type (p-type) amorphous—n-type (p-type) drain region. These structures can be formed by performing ion implantation only one time. The same effects as obtained by LDD structures are expected also by these structure as described in Japanese Application No. Hei3-238713 filed by the same applicant.

As explained above in details, a variety of structures for MOSFETs can be formed in accordance with the present invention without a special process or a complicated procedure but only by the technique utilizing anoding (anodic oxidation).

Figure 7A:
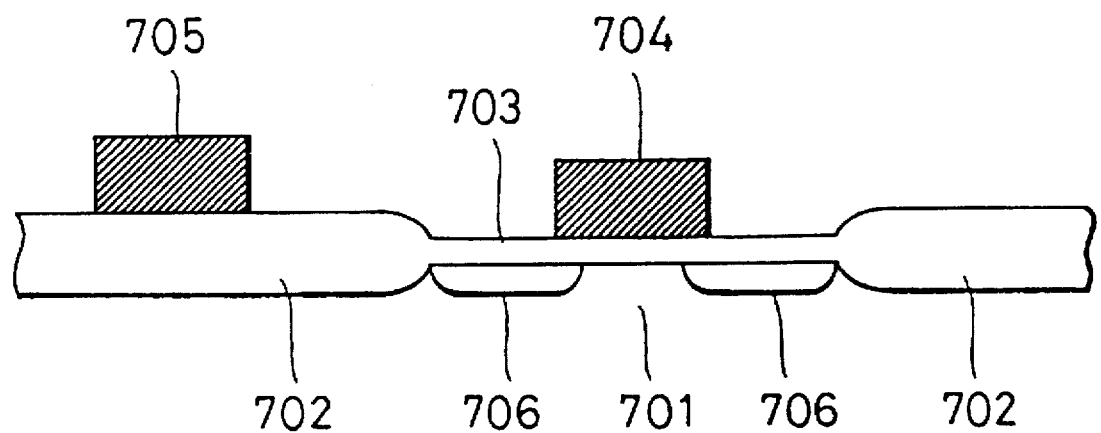
FIGS. 7, (A)–(C), are cross-sectional views of a MOSFET according to the invention, for illustrating steps successively performed to fabricate the device.
Figure 7B:
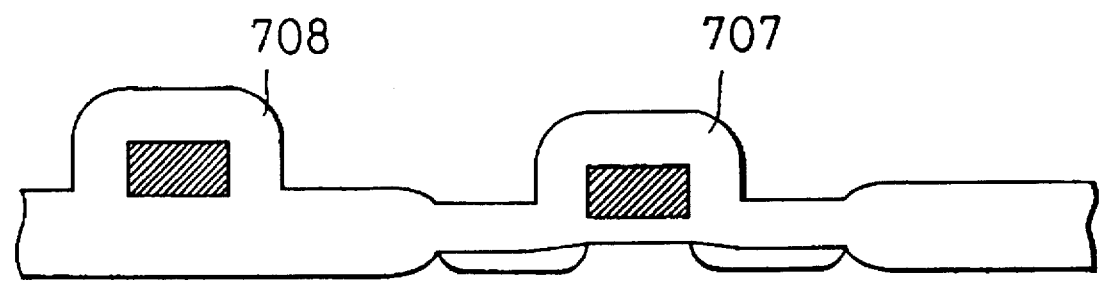
Figure 7C:
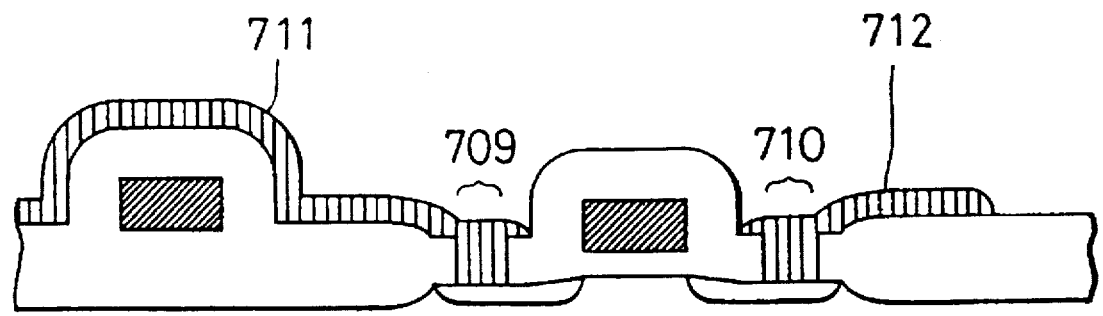
Figure 8A:
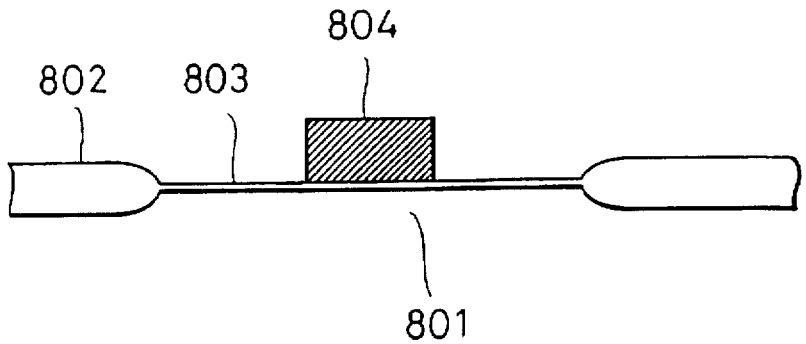
FIGS. 8, (A)–(C), are cross-sectional views of another MOSFET according to the invention, for illustrating steps successively performed to fabricate the device.
Figure 8B:
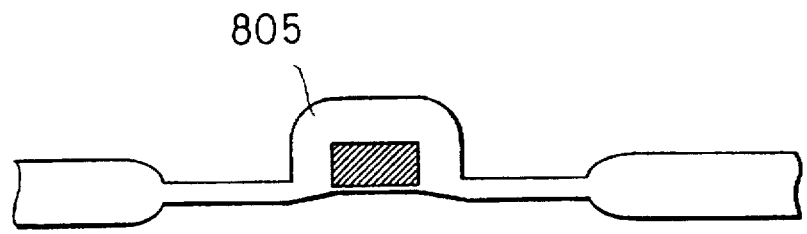
Figure 8C:
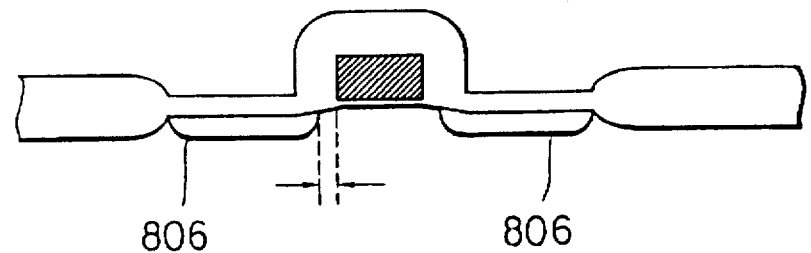
Figure 9A:
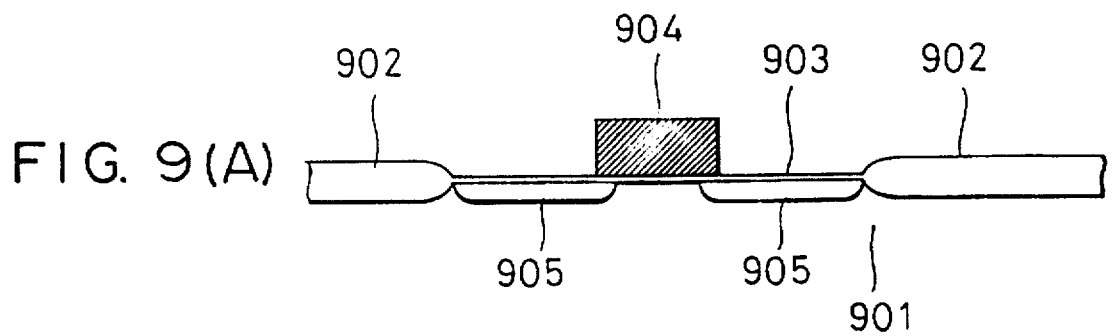
FIGS. 9, (A)–(C), are cross-sectional views of a MOSFET having lightly doped drain regions according to the invention.
Figure 9B:
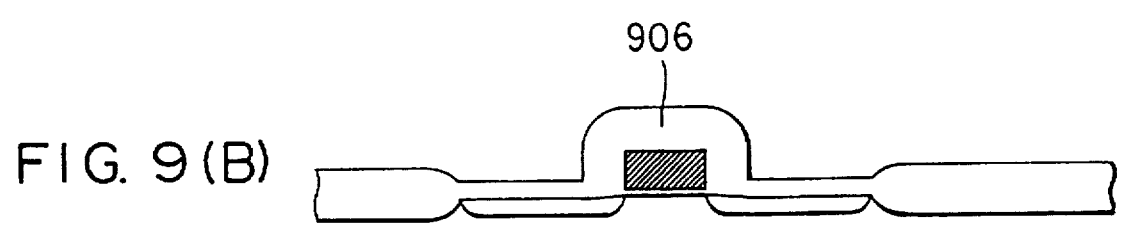
Figure 9C:
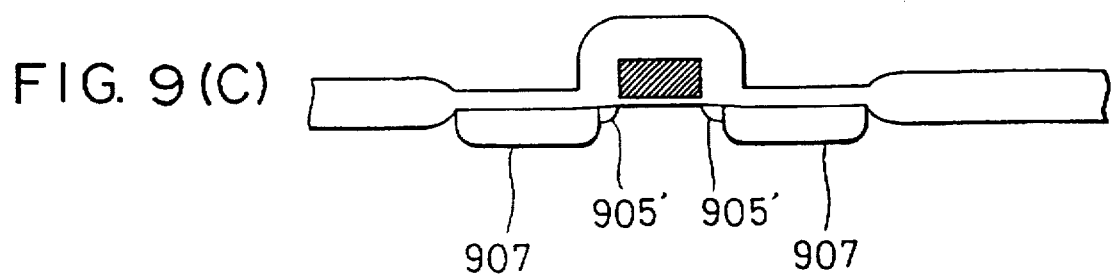
Figure 10A:
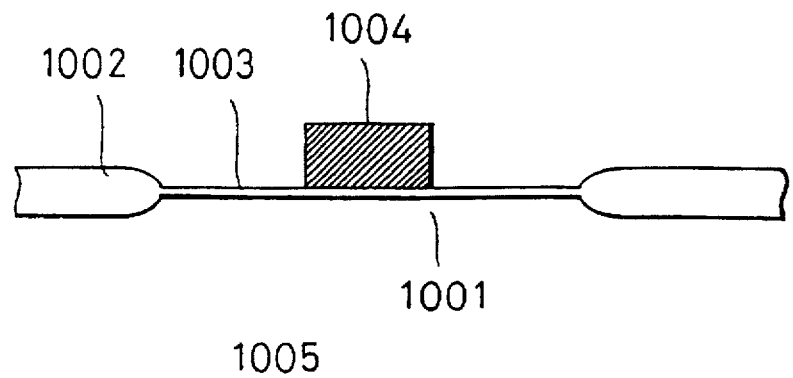
FIGS. 10, (A)–(D), are cross-sectional views of a MOSFET having amorphous regions according to the invention.
Figure 10B:
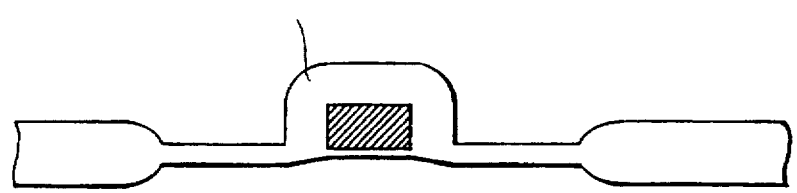
Figure 10C:
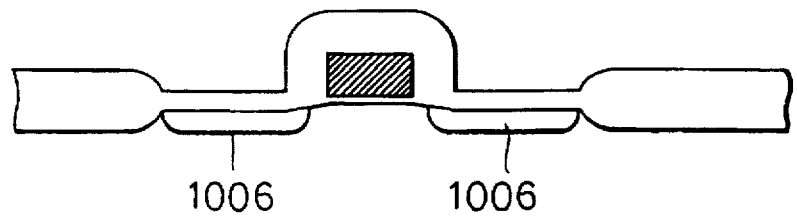
Figure 10D:
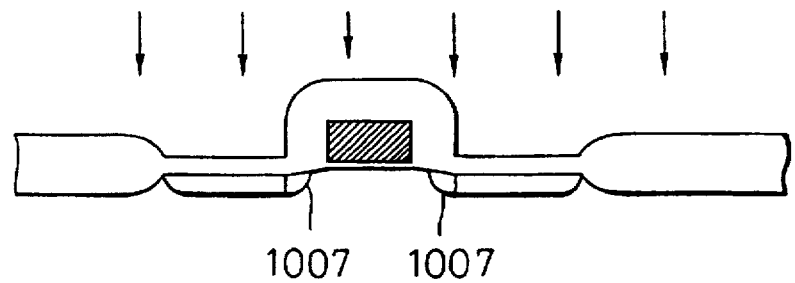

Referring to FIGS. 7(A) to 7(C), an n-channel MOSFET formed on a substrate of a single crystal of silicon in accordance with a fifth embodiment of the present invention will be explained. As shown in FIG. 7(A), a field insulator 702, an underlying p⁺-type channel stopper (not shown), a gate oxide film 703, a polysilicon (polycrystalline silicon) gate electrode 704 doped with phosphorus, a gate interconnection 705, and n⁺-type doped regions 706 doped with arsenic were formed over a substrate 701 of a p-type single crystal of silicon by a conventional IC fabrication method. The gate interconnection 705 extends from the gate electrode 704 to the upper surface of the field insulator 702.

The method of fabrication is now described in detail. First, $BF_2^+$ ions were implanted into the (100) plane of the p-type silicon wafer at a density of about $10^{15}$ atoms/cm$^3$. Then, the field insulator 702 and the underlying channel stopper (not shown) were formed by the LOCOS (localized-oxidation technology).

Subsequently, a gate-insulating film having a thickness of 70 nm was formed from silicon oxide by thermal oxidation. A polysilicon film having a thickness of 500 nm and doped with phosphorus at a density of $0.8 \times 10^{20}$ to $1.5 \times 10^{20}$ atoms/cm$^3$ was formed by low-pressure CVD. These films were patterned to form a portion 704 becoming a gate electrode and the gate interconnection 705. Arsenic ions were implanted to form the n$^+$-type doped regions 706 having a dopant concentration of $0.2 \times 10^{20}$ to $0.9 \times 10^{20}$ atoms/cm$^3$ by a self-aligned process. The thickness of the doped regions 706 was 100 nm. The doped regions were annealed at 900° C. for 1 hour to activate it.

Then, as shown in FIG. 7(B), oxide layers 707 and 708 were formed on the surfaces of the gate electrode 704 and of the gate interconnection 705, respectively, by thermal oxidation. For the oxidation, the laminate was heated at 800° C. within dry oxygen at 1 atm. for 500 minutes. As a result, silicon oxide layers 707 and 708 having a thickness of about 100 nm were formed around the gate electrode and around the first conductive interconnection, respectively. By this oxidation step the silicon surfaces of the gate electrode and of the first conductive interconnection were made to recede about 50 nm. On the other hand, the surface of the substrate of the single crystal of silicon also receded about 10 nm. This recession was quite small and hardly affected the characteristics of the semiconductor device.

The silicon oxide films 707 and 708 were formed by the method described thus far, thereby producing the laminate shown in FIG. 7(B). Then, windows 709 and 710 were photolithographically formed to permit formation of source and drain electrodes, respectively.

Finally, a coating of aluminum or tungsten was formed and etched to form source electrode and interconnection 711 and drain electrode and interconnection 712. Although the source electrode and interconnection 711 intersected the gate interconnection 705, no electrical short circuit took place, because a dense film of silicon oxide was formed on the upper and side surfaces of the gate interconnection 705. The resulting laminate is shown in FIG. 7(C).

In this way, in accordance with the present invention, upper conductive interconnections, or second conductive interconnections, can be formed without forming an interlayer insulator on a MOSFET, because the lower conductive interconnections including the gate interconnection and electrode have been already coated with thermal oxide. As a result, the step at the electrode portion connecting the upper conductive interconnections with the substrate is reduced. In practice, in the present example, the interlayer insulator was 100 nm thick, while the step was 80 nm. In the past, the step is the sum of the thickness of a gate oxide film and the thickness of an interlayer insulator and equal to 170 nm. That is, the present invention has successfully halved the step.

The above-described method yields other advantages. When a conventional interlayer insulator is formed, steps exist especially on the side surfaces of the gate interconnection 705. The interlayer insulator cannot fully cover the steps, so that cracks occur. The result is that an electrical short circuit to the upper interconnections is often induced. On the other hand, an oxide formed by thermal oxidation is dense and resistant to high voltages. In addition, the oxide coats the surroundings of the gate interconnection without gap. Hence, it is by no means necessary to take account of defects due to such steps. The oxide contributes to a great improvement in the production yield.

The present invention makes it possible to fabricate integrated circuits with a quite high production yield. In a multilayer metallization circuit, a defect due to a short circuit of a lower conductive interconnection such as a gate interconnection to an upper conductive interconnection such as a source or drain interconnection poses a serious problem. The coating of silicon oxide, for example, used as an interlayer insulator is formed by CVD and, therefore, the coating cannot fully cover the unevenness of the conductive interconnections, resulting in nonuniform thickness. Especially, short circuits often take place on the side surfaces of the lower conductive interconnections. In accordance with the present invention, an oxide film having a sufficient voltage-resistance can be formed at a uniform thickness at every location, including on the side and upper surfaces of the lower conductive interconnections. Consequently, the present invention has successfully solved such a problem.

The step at the portion connecting the upper interconnections with the substrate has caused breaking of conductive interconnections. The step is equal to the distance between different metallization layers. The invention can greatly reduce the step, thus decreasing defects.

Also, with respect to the MOSFET structure, the positional relation between the gate electrode and the doped regions can be set at will. Moreover, a lightly doped drain structure can be manufactured much more easily and with less restrictions than heretofore. As described already, a lightly doped drain region can be formed with quite high accuracy such that the aspect ratio of the gate electrode imposes few limitations on the formation. The novel method is especially effective in increasing the aspect ratio of the gate electrode, which is considered to enjoy wider acceptance because of the adoption of a single channel and increases in the device density.

Of course, the invention can be applied to conventional gate electrodes having small aspect ratios less than 1. In this case, the manufacturing step for forming an insulating film for creating spacers and an anisotropic etching step which would have been needed in the prior art techniques are dispensed with. Also, the width of the lightly doped drain region can be control led accurately and, therefore, the invention yields excellent advantages. A conventional lightly doped drain structure can be formed easily by the novel method. Additionally, expanded or modified versions of this structure can be easily fabricated by the novel method.

In the description made thus far, the invention is applied to semiconductor devices consisting mainly of silicon. Obviously, the invention can also be applied to semiconductor devices made of other materials such as germanium, silicon carbide, and gallium arsenide.

Figure 11A:
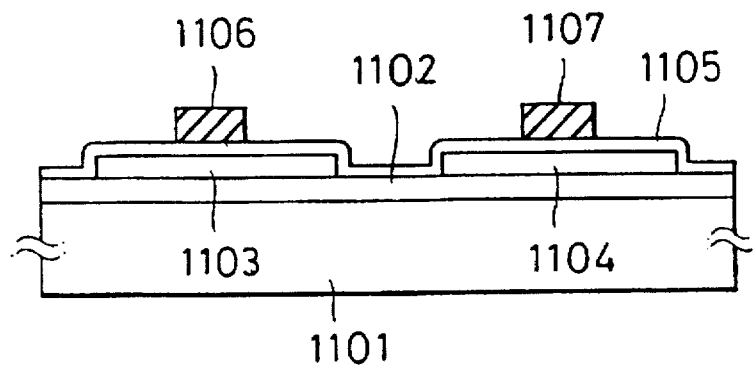
FIG. 11 shows a method of manufacturing a TFT in accordance with the present invention.

Referring to FIGS. 11(A) to 11(D), a TFT in accordance with a sixth embodiment of the present invention will be described. Detailed conditions of the manufacturing process of the TFT in accordance with the sixth embodiment are nearly the same as those described in Japanese patent applications Nos. Hei4-30220 and Hei4-38637 filed by the present inventors. A Corning 7059 glass manufactured by Corning Incorporated was used as a substrate 1101. A base silicon oxide film 1102 was formed to a thickness of 100 to 800 nm by sputtering. An amorphous silicon film was formed thereon to a thickness of 20 to 100 nm by plasma CVD and annealed and crystallized in a nitrogen atmosphere at 600° C. for 12 to 72 hours. The silicon film was patterned by photolithography and reactive ion etching (RIE) to form semiconductor island regions 1103 (N-channel TFT) and 1104 (P-channel TFT) as shown in FIG. 11(A).

A gate oxide film 1105 was deposited to a thickness of 50 to 200 nm by sputtering in an oxygen atmosphere with silicon oxide as a target. Then, an aluminum film was formed by sputtering or electron beam evaporation and patterned by a mixed acid (a phosphoric acid solution having added therein 5% nitric acid) to form gate electrodes and interconnections 1106 and 1107 as shown in FIG. 11(A).

Figure 12:
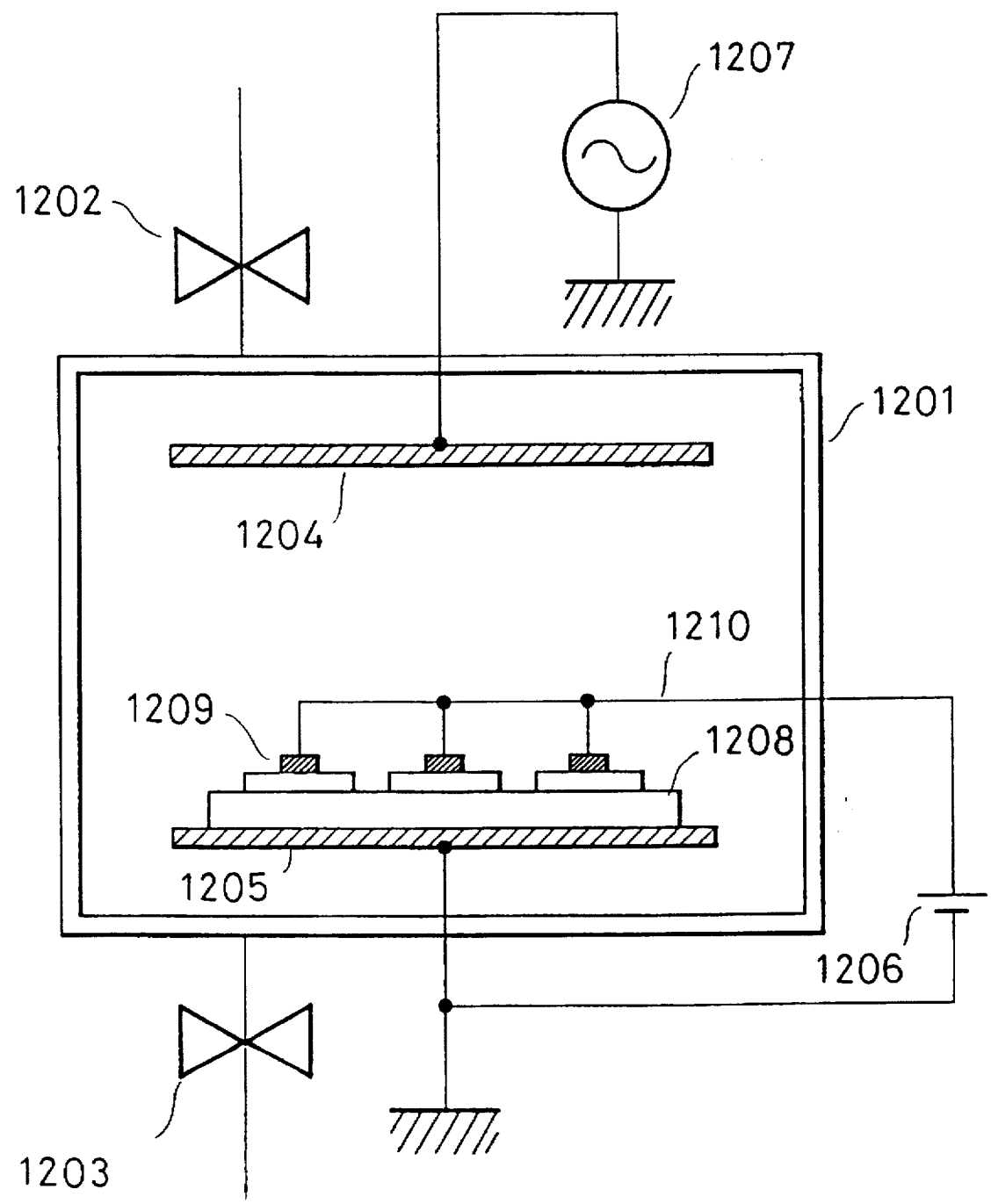
FIG. 12 shows an example of a plasma anodic oxidation apparatus in accordance with the present invention.

Aluminum oxide films 1108 and 1109 were formed in plasma by anodic oxidation. An apparatus for the plasma anodic oxidation has a structure shown in FIG. 12. A chamber 1201 of the apparatus is provided with a valve 1202 for introducing an oxidizing gas and an evacuation valve 1203. An oxidizing gas is introduced into the chamber through the valve 1202 and exhausted through the valve 1203. The chamber 1201 is also provided with electrodes 1204 and 1205. The electrode 1204 is connected with an RF power source 1207. The electrode 1205 is grounded. A sample is placed on the electrode 1205. The sample comprises an insulating substrate 1208 and TFTs 1209 provided on the insulating substrate 1208. Gate electrodes of the TFTs are connected with a d.c. power source 1206 together through a wiring 1210.

The anodic oxidation could be carried out as follows. First, oxygen was introduced into the chamber 1201 at a flow rate of 50 SCCM. The pressure was adjusted to 50 mTorr. A high frequency plasma (1 KHz to 100 MHz, typically 13.56 MHz) was generated by the RF power source 1207. A d.c. plasma, an alternating plasma (5 to 1000 Hz), or a microwave plasma (100 MHz to 100 GHz) may be used instead of the high frequency plasma. The distribution of the plasma was controlled so that the substrate 1208 might be adjacent to the plasma. A positive bias voltage of several volts to several hundreds volts was applied between the gate electrode/interconnection and the grounded electrode 1205 by the d.c. power source 1206.

Figure 11B:
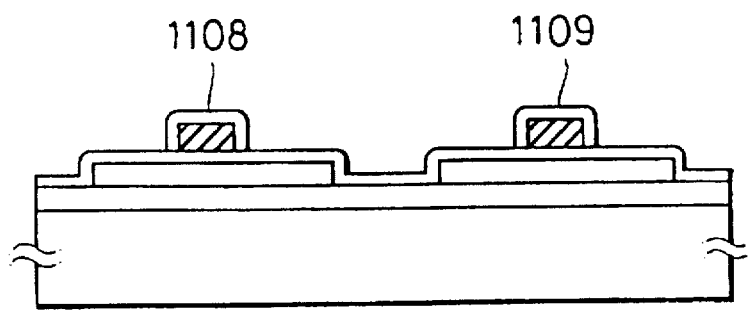

In the case of the anodic oxidation (plasma anodic oxidation) under the above-described conditions, the oxidation rate was about 10 nm/minute. In this way, a 0.1 to 0.5 μm thick aluminum oxide film could be obtained. The aluminum oxide film was so flat and dense that any special structure could not be observed by electron microscope. The aluminum oxide film had a dielectric strength of 10 MV/cm or more without performing hot water process as carried out in case of conventional wet anodic oxidation. Thus, the anodic oxidation film was formed as shown in FIG. 11(B).

Then, an n-type impurity was implanted into the semiconductor region 1103 and a p-type impurity was implanted into the semiconductor region 1104 by a known ion implantation to form n-type impurity regions (source and drain) 1110 and p-type impurity regions 1112 and 1113. This process was carried out by a known CMOS technique.

Figure 11C:
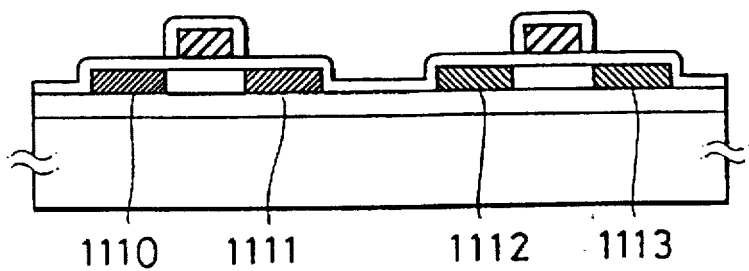
Figure 11D:
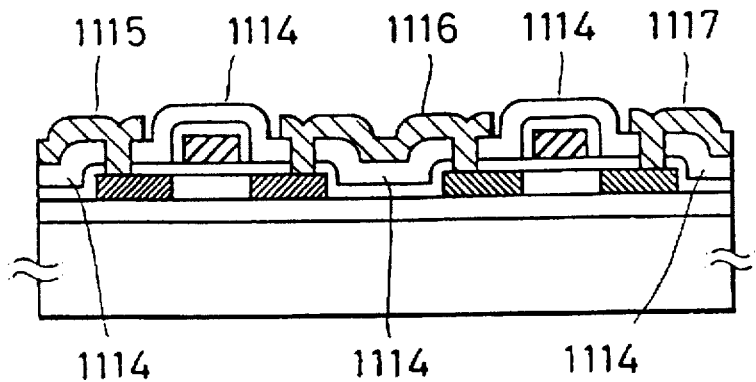

In this way, a structure shown in FIG. 11(C) was obtained. Crystallinity of the parts into which the impurities were implanted by the above ion implantation was greatly deteriorated and thereby became substantially non-crystalline (amorphous state or polycrystalline state close thereto). Crystallinity was recovered by laser annealing. Conditions of the laser annealing were for example those described in Japanese patent application No. Hei4-30220. After the laser annealing, annealing was carried out in a hydrogen atmosphere at 250° to 450° C. for 30 minutes to 3 hours under 1 to 700 torr, preferably 500 to 700 torr to add hydrogen to the semiconductor regions and reduce lattice defect such as dangling bonds and the like.

Then, an interlayer insulator 1114 was formed by formation of a silicon oxide film by sputtering. Contact holes were formed by a known photolithography to expose a surface of the semiconductor region or the gate electrode/interconnection. Finally, a metal film (aluminum or chromium) was selectively formed to obtain electrodes and interconnections 1115 to 1117. In this way, an NMOS TFT and a PMOS TFT were formed.

In accordance with the sixth embodiment, TFT could be formed with extremely high yield. There is no contamination of sodium and the like in an activation layer of TFT obtained in accordance with the sixth embodiment. In a conventional multi-layer interconnection circuit, it was a big problem that failure was generated by short circuit between the lower interconnection such as a gate interconnection and the upper interconnection such as source and drain interconnections. The short circuit takes place through a silicon oxide interlayer insulator formed on an undulation of an interconnection (wiring) since the undulation can not be covered completely by deposition of the silicon oxide thereon. The silicon oxide interlayer insulator was thick at a portion thereof and thin at another portion thereof. In particular, short circuit was liable to take place on a side surface of the lower interconnection. However, in the present invention, an anodic oxidation film can be formed at a uniform thickness from a side surface of the lower interconnection to an upper (top) surface thereof with a sufficient dielectric strength. Accordingly, the problem can be solved. Insulation between interconnections (wirings) can be further enhanced by forming the anodic oxidation film of the present invention and subsequently forming a conventional interlayer insulator thereon.

Although a semiconductor device (TFT) formed on an insulating substrate was described in the above description, the present invention can be applied to a TFT formed on a semiconductor integrated circuit.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. For example, the present invention can be applied to semiconductor devices made of germanium semiconductors, silicon carbide semiconductors, gallium arsenic semiconductors or other suitable semiconductors in the same manner as those utilizing silicon semiconductors.

What is claimed:

1. A method of forming a semiconductor integrated circuit comprising the steps of:

forming a field insulating region made on a semiconductor by locally oxidizing a surface thereof in order to define an active region;

forming an insulating film functioning as a gate insulating film on an exposed area of said semiconductor;

forming a first wiring comprising silicon on said field insulating film;

oxidizing surfaces of said first wiring by anodic oxidation; and forming a second wiring over said first wiring.

2. A method of forming a semiconductor integrated circuit comprising the steps of:

forming a field insulating film in order to define an active region on a semiconductor;

forming an insulating film functioning as a gate insulating film on said active region of the semiconductor;

forming impurity regions within said semiconductor;

forming a lower wiring over said semiconductor, said lower wiring including a gate electrode located over said active region and a gate wiring extending on said field insulating film;

anodic oxidizing said lower wiring to form an oxide film thereon; and forming an upper wiring over said lower wiring with said oxide film interposed therebetween.

3. The method of forming a semiconductor integrated circuit as claimed in claim 2 wherein said impurity region forming step is carried out in order to form a source region and a drain region with a channel region therebetween.

4. The method of forming a semiconductor integrated circuit as claimed in claim 2 wherein said anodic oxidation is carried out in an electrolyte with said first wiring being connected to a positive terminal of a voltage source.

5. The method of forming a semiconductor integrated circuit as claimed in claim 2 wherein said anodic oxidation is carried out in an electrolyte with a platinum electrode being connected to a negative terminal of the voltage source.

6. The method of forming a semiconductor integrated circuit as claimed in claim 5 wherein said electrolyte is an ethylene glycol solution of tartaric acid.

7. The method of forming a semiconductor integrated circuit as claimed in claim 6 wherein said electrolyte is neutralized by addition of ammonia.

8. The method of forming a semiconductor integrated circuit as claimed in claim 2 wherein said impurity regions forming step is carried out by ion implantation.

9. The method of forming a semiconductor integrated circuit as claimed in claim 2 wherein said upper wiring is made of a metal.

10. The method of forming a semiconductor integrated circuit as claimed in claim 9 wherein said upper wiring is made of aluminum.

11. The method of forming a semiconductor integrated circuit as claimed in claim 2 wherein said anodic oxidation is carried out by causing plasma discharge in a vacuum chamber grounded and filled with an oxidizing gas with said lower wiring being connected to a positive terminal of a voltage source.

12. A method for forming a semiconductor device comprising the steps of:

forming a field insulating film on a semiconductor by locally oxidizing a surface thereof in order to define an active region;

forming a first wiring comprising a material selected from the group consisting of silicon, germanium, tungsten silicide, and molybdenum silicide on said field insulating surface;

oxidizing a surface of said first wiring by anodic oxidation; and forming a second wiring comprising aluminum over said first wiring.

13. The method of claim 2 wherein said lower wiring comprises a material selected from the group consisting of tungsten, molybdenum, silicon, tungsten silicide, molybdenum silicide, titanium, aluminum, tantalum, and chromium.

14. The method of claim 2 wherein said lower wiring comprises a multilayer of a phosphorous doped silicon film and a silicide film selected from the group consisting of tungsten silicide, molybdenum silicide.

15. The method of claim 12 wherein said anodic oxidation is carried out by supplying a positive voltage to said first wiring in a reduced pressure plasma.

16. The method of claim 15 wherein said reduced pressure plasma is produced by an electric field to an oxidizing atmosphere.

17. The method of claim 16 wherein said oxidizing atmosphere comprises oxygen, $N_2O$, NO or $NO_2$.

18. The method of claim 1 wherein said semiconductor comprises a semiconductor substrate or a semiconductor layer disposed on an insulating surface.

19. The method of claim 2 wherein said semiconductor comprises a semiconductor substrate or a semiconductor layer disposed on an insulating surface.

20. The method of claim 12 wherein said insulating surface is provided on a semiconductor substrate.

21. A method of forming a semiconductor integrated circuit comprising the steps of:

forming a field insulating film on a semiconductor;

forming a gate insulating film on an exposed area of said semiconductor;

forming a first wiring on said field insulating film;

forming a second wiring on said gate insulating film; and oxidizing surfaces of said first and second wirings by anodic oxidation;

wherein said first wiring is formed with the same material as said second wiring, and an anodic oxide of said first wiring is formed with the same material as that of said second wiring.

22. The method of claim 21 wherein the material of said first and second wiring is selected from the group consisting of tungsten, molybdenum, silicon, tungsten silicide, molybdenum silicide, titanium, aluminum, tantalum, and chromium.

23. The method of claim 21 wherein the material of said anodic oxide comprises a silicon oxide film.

24. A method of forming a semiconductor integrated circuit comprising the steps of:

forming a field insulating film on a semiconductor to define an active region;

forming a gate insulating film on an exposed area of said semiconductor;

forming a first wiring over said semiconductor, said first wiring including a gate electrode over said active region and a gate wiring extending on said field insulating film;

performing a first ion introduction into said active region with said gate electrode as a mask at a first concentration;

oxidizing a surface of said said first wiring by anodic oxidation to form an oxide insulating film on said first wiring;

performing a second ion introduction into said active region with said gate electrode and the oxide insulating film as a mask at a second concentration larger than said first concentration, thereby forming a pair of impurity regions in said active region;

forming a second wiring over said first wiring with said oxide insulating film interposed therebetween;

wherein said second wiring extends over said field insulating film and is connected to one of said impurity regions.

25. The method of claim 24 wherein said impurity regions are source and drain regions.

26. The method of claim 24 wherein said field insulating film is formed by locally oxidizing said semiconductor.

* * * * *